US011211250B2

(12) United States Patent
Sakamoto et al.

(10) Patent No.: US 11,211,250 B2
(45) Date of Patent: Dec. 28, 2021

(54) LAMINATED ELEMENT MANUFACTURING METHOD

(71) Applicant: HAMAMATSU PHOTONICS K.K., Hamamatsu (JP)

(72) Inventors: Takeshi Sakamoto, Hamamatsu (JP); Ryuji Sugiura, Hamamatsu (JP); Yuta Kondoh, Hamamatsu (JP); Naoki Uchiyama, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/633,808

(22) PCT Filed: Jul. 13, 2018

(86) PCT No.: PCT/JP2018/026532
§ 371 (c)(1),
(2) Date: Jan. 24, 2020

(87) PCT Pub. No.: WO2019/021865
PCT Pub. Date: Jan. 31, 2019

(65) Prior Publication Data
US 2021/0057222 A1 Feb. 25, 2021

(30) Foreign Application Priority Data
Jul. 28, 2017 (JP) .............................. JP2017-146861

(51) Int. Cl.
H01L 21/268 (2006.01)
H01L 21/683 (2006.01)
H01L 25/065 (2006.01)

(52) U.S. Cl.
CPC ........ H01L 21/268 (2013.01); H01L 21/6835 (2013.01); H01L 25/0657 (2013.01)

(58) Field of Classification Search
CPC ....... H01L 24/83; H01L 21/268; H01L 21/78; H01L 24/27; H01L 24/29; H01L 24/32;
(Continued)

(56) References Cited

U.S. PATENT DOCUMENTS

| 8,415,232 | B2* | 4/2013 | Kajiyama | ............... H01L 21/78 438/460 |
| 8,901,727 | B2* | 12/2014 | Kang | ...................... H01L 23/28 257/686 |
| 2016/0163916 | A1* | 6/2016 | Ilievski | ............... H01L 33/0095 438/33 |

FOREIGN PATENT DOCUMENTS

JP 2006-013312 A 1/2006
JP 2007-142001 A 6/2007
(Continued)

OTHER PUBLICATIONS

International Preliminary Report on Patentability dated Feb. 6, 2020 for PCT/JP2018/026532.

Primary Examiner — Vu A Vu
(74) Attorney, Agent, or Firm — Faegre Drinker Biddle & Reath LLP

(57) ABSTRACT

A laminated element manufacturing method includes a first forming step of forming a first modified region along a line to cut by irradiating a semiconductor substrate of a first wafer with a laser light along the line to cut, a first grinding step of grinding the semiconductor substrate of the first wafer, a bonding step of bonding a circuit layer of a second wafer to the semiconductor substrate of the first wafer, a second forming step of forming a second modified region along the line to cut by irradiating a semiconductor substrate of the second wafer with a laser light along the line to cut, and a second grinding step of grinding the semiconductor substrate of the second wafer.

7 Claims, 31 Drawing Sheets

(58) Field of Classification Search
CPC ....... H01L 27/0688; H01L 2224/83947; H01L 21/8221; B23K 26/00; B23K 26/53
USPC ........................................................ 438/462
See application file for complete search history.

(56) References Cited

FOREIGN PATENT DOCUMENTS

| | | |
|---|---|---|
| JP | 2009-289773 A | 12/2009 |
| JP | 2010-103245 A | 5/2010 |
| JP | 2012-109357 A | 6/2012 |
| JP | 2014-017434 A | 1/2014 |
| JP | 2014-028388 A | 2/2014 |
| JP | 2015-050226 A | 3/2015 |
| JP | 2015-119109 A | 6/2015 |

\* cited by examiner (a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

LAMINATED ELEMENT MANUFACTURING METHOD

TECHNICAL FIELD

The present disclosure relates to a laminated element manufacturing method.

BACKGROUND ART

Patent Literature 1 discloses a method of cutting a semiconductor wafer. In the method, the street of the semiconductor wafer is cut in a manner that a cutting blade that rotates at high speed is lowered while a chuck table is caused to reciprocate, in a state where the semiconductor wafer is attracted and held on the chuck table. The semiconductor wafer is diced by performing the above cutting on all streets, and thus is divided into individual semiconductor chips.

CITATION LIST

Patent Literature

Patent Literature 1: Japanese Unexamined Patent Publication No. 2006-013312

SUMMARY OF INVENTION

Technical Problem

Currently, for example, in a field of a semiconductor memory such as a dynamic random access memory (DRAM), development of a laminated element configured by laminating a plurality of elements proceeds, and both thinning of the laminated element and improvement of yield are expected to be realized.

Thus, an object of the present disclosure is to provide a laminated element manufacturing method in which it is possible to achieve both thinning of a laminated element and improvement of yield.

Solution to Problem

According to an aspect of the present disclosure, a laminated element manufacturing method includes a first forming step of preparing a first wafer as a semiconductor wafer including a semiconductor substrate having a front surface and a back surface, and a circuit layer including a plurality of functional elements two-dimensionally arranged along the front surface, and forming a first modified region along a line to cut by irradiating the semiconductor substrate of the first wafer with a laser light along the line to cut set to pass between each of the functional elements, a first grinding step of grinding the semiconductor substrate of the first wafer after the first forming step, a bonding step of preparing a second wafer as the semiconductor wafer and bonding the circuit layer of the second wafer to the semiconductor substrate of the first wafer such that each of the functional elements of the first wafer correspond to each of the functional elements of the second wafer, after the first grinding step, a second forming step of forming a second modified region along the line to cut by irradiating the semiconductor substrate of the second wafer with a laser light along the line to cut, after the bonding step, and a second grinding step of grinding the semiconductor substrate of the second wafer after the second forming step.

In the laminated element manufacturing method, since a flow of grinding the semiconductor substrate of the first wafer, bonding the circuit layer of the second wafer to the semiconductor substrate of the first wafer, and grinding the semiconductor substrate of the second wafer is repeated, it is possible to obtain a laminated body in which a plurality of semiconductor wafers are laminated, in a state where each semiconductor substrate is thinned. In addition, since the modified region is formed in each semiconductor substrate before the semiconductor substrate is ground, it is possible to obtain a laminated body in which the modified region is formed in each semiconductor substrate. Here, if blade dicing is used for cutting the laminated body as described above, the yield is significantly reduced by chipping at a bonding interface of the semiconductor wafer. On the contrary, in the laminated element manufacturing method, since the fracture extends from the modified region formed in each semiconductor substrate, it is possible to cut the laminated body while suppressing an occurrence of chipping at the bonding interface of the semiconductor wafer. Thus, according to the laminated element manufacturing method, it is possible to achieve both thinning of the laminated element and improvement of the yield.

According to the aspect of the present disclosure, in the laminated element manufacturing method, in the first forming step, a first fracture extending from the first modified region toward the circuit layer of the first wafer may be formed. According to this configuration, it is possible to easily cut the laminated body along the line to cut with high accuracy.

According to the aspect of the present disclosure, in the laminated element manufacturing method, in the first grinding step, the first modified region may be removed, and the first fracture may be exposed to the back surface of the semiconductor substrate of the first wafer. According to this configuration, since the first modified region does not remain on a cut surface of the manufactured laminated element, it is possible to suppress degradation of flexural strength of the laminated element.

According to the aspect of the present disclosure, in the laminated element manufacturing method, in the second forming step, a second fracture extending from the second modified region toward the circuit layer of the second wafer may be formed. According to this configuration, it is possible to easily cut the laminated body along the line to cut with high accuracy.

According to the aspect of the present disclosure, in the laminated element manufacturing method, in the second forming step, the second fracture may be formed to reach an interface between the semiconductor substrate of the first wafer and the circuit layer of the second wafer. According to this configuration, it is possible to more easily cut the laminated body along the line to cut with higher accuracy.

According to the aspect of the present disclosure, in the laminated element manufacturing method, in the second grinding step, the second modified region may be removed, and the second fracture may be exposed to the back surface of the semiconductor substrate of the second wafer. According to this configuration, since the second modified region does not remain on the cut surface of the manufactured laminated element, it is possible to suppress degradation of flexural strength of the laminated element.

According to another aspect of the present disclosure, a laminated element manufacturing method includes a first grinding step of preparing a first wafer as a semiconductor wafer including a semiconductor substrate having a front surface and a back surface, and a circuit layer including a plurality of functional elements two-dimensionally arranged along the front surface, and grinding the semiconductor substrate of the first wafer, a bonding step of preparing a second wafer as the semiconductor wafer and bonding the circuit layer of the second wafer to the semiconductor substrate of the first wafer such that each of the functional elements of the first wafer correspond to each of the functional elements of the second wafer, after the first grinding step, a forming step of forming a modified region along a line to cut by irradiating a semiconductor substrate of the second wafer with a laser light along the line to cut set to pass between each of the functional elements, after the bonding step, and a second grinding step of grinding the semiconductor substrate of the second wafer after the forming step.

In the laminated element manufacturing method, since a flow of grinding the semiconductor substrate of the first wafer, bonding the circuit layer of the second wafer to the semiconductor substrate of the first wafer, and grinding the semiconductor substrate of the second wafer is repeated, it is possible to obtain a laminated body in which a plurality of semiconductor wafers are laminated, in a state where each semiconductor substrate is thinned. In addition, since the modified region is formed in one semiconductor substrate among a plurality of semiconductor substrates before the semiconductor substrates are ground, it is possible to obtain a laminated body in which the modified region is formed in at least one semiconductor substrate. Here, if blade dicing is used for cutting the laminated body as described above, the yield is significantly reduced by chipping at a bonding interface of the semiconductor wafer. On the contrary, in the laminated element manufacturing method, since the fracture extends from the modified region formed in at least one semiconductor substrate, it is possible to cut the laminated body while suppressing an occurrence of chipping at the bonding interface of the semiconductor wafer. Thus, according to the laminated element manufacturing method, it is possible to achieve both thinning of the laminated element and improvement of the yield.

According to the aspect of the present disclosure, in the laminated element manufacturing method, in the forming step, a fracture extending from the modified region toward the circuit layer of the second wafer may be formed. According to this configuration, it is possible to easily cut the laminated body along the line to cut with high accuracy.

According to the aspect of the present disclosure, in the laminated element manufacturing method, in the forming step, the fracture may be formed to reach an interface between the circuit layer of the first wafer and the semiconductor substrate of the first wafer. According to this configuration, it is possible to more easily cut the laminated body along the line to cut with higher accuracy.

According to the aspect of the present disclosure, in the laminated element manufacturing method, in the second grinding step, the modified region may be removed, and the fracture may be exposed to the back surface of the semiconductor substrate of the second wafer. According to this configuration, since the modified region does not remain on the cut surface of the manufactured laminated element, it is possible to suppress degradation of flexural strength of the laminated element.

According to the aspect of the present disclosure, the laminated element manufacturing method may further include a pick-up step of picking up a plurality of laminated elements obtained by cutting the first wafer and the second wafer along the line to cut, after the second grinding step.

According to this configuration, it is possible to obtain a laminated element with high efficiency.

Advantageous Effects of Invention

According to the present disclosure, it is possible to provide a laminated element manufacturing method in which it is possible to achieve both thinning of a laminated element and improvement of yield.

DESCRIPTION OF EMBODIMENTS

Figure 1:
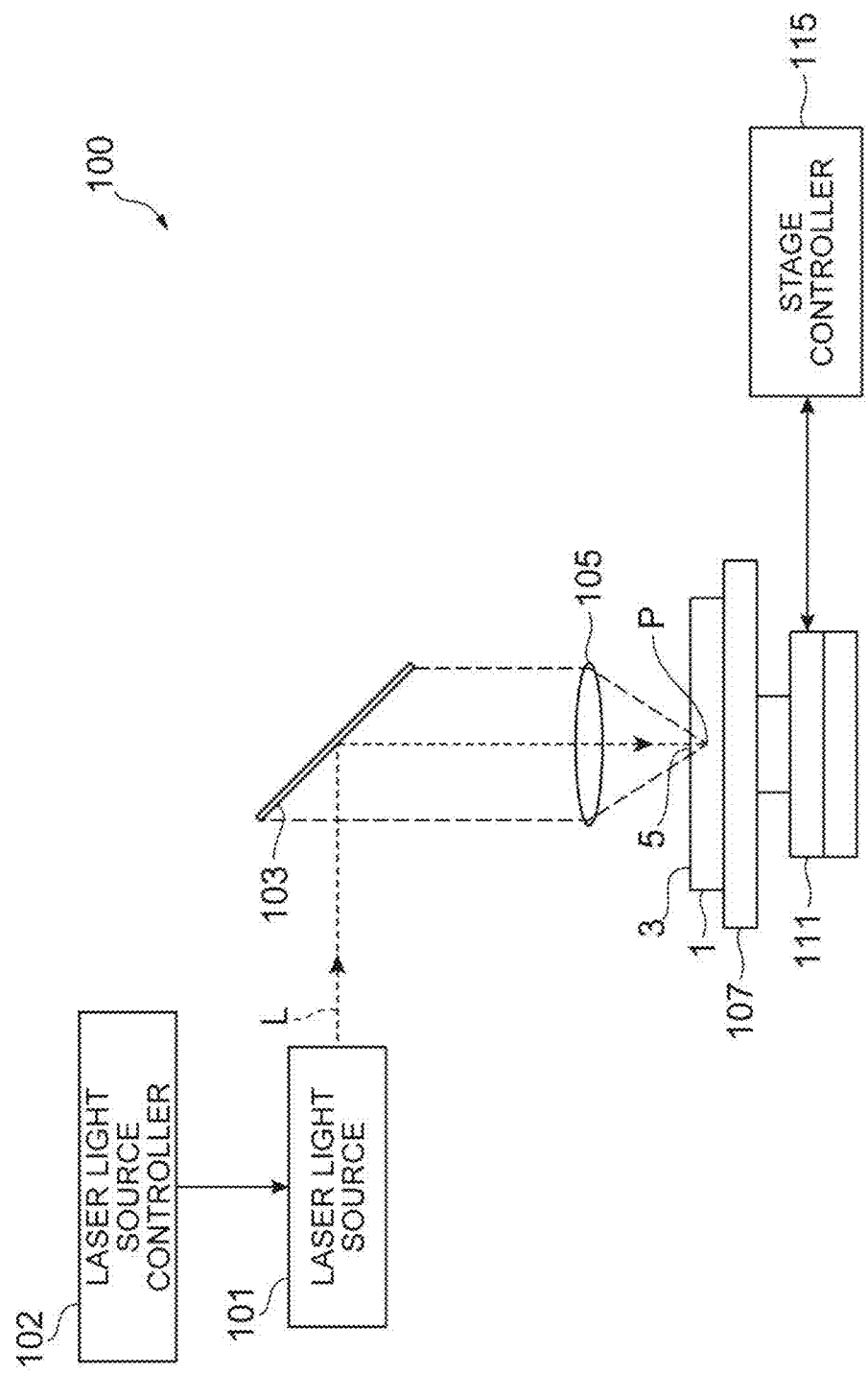
FIG. 1 is a schematic configuration diagram illustrating a laser processing device used for forming a modified region.

Hereinafter, embodiments of the present disclosure will be described in detail with reference to the drawings. In the drawings, the same elements or the corresponding elements are denoted by the same reference signs, and repetitive descriptions thereof will be omitted.

[Formation of Modified Region]

According to an embodiment, in a laminated element manufacturing method, a modified region is formed in a processing target along a line to cut by condensing a laser light on the processing target (laminated body of semiconductor wafers as an example). Firstly, formation of the modified region will be described with reference to FIGS. 1 to 6.

As illustrated in FIG. 1, a laser processing device 100 includes a laser light source 101 that pulse-oscillates a laser light L, a dichroic mirror 103 arranged to change the direction of an optical axis (optical path) of the laser light L by 90°, and a condensing lens 105 that condenses the laser light L. Further, the laser processing device 100 includes a support base 107 for supporting a processing target 1 irradiated with the laser light L condensed by the condensing lens 105, a stage 111 for moving the support base 107, a laser light source controller 102 that controls the laser light source 101 in order to adjust an output, a pulse width, a pulse waveform, or the like of the laser light L, and a stage controller 115 that controls movement of the stage 111.

In the laser processing device 100, regarding the laser light L emitted from the laser light source 101, the direction of the optical axis of the laser light L is changed by 90° by the dichroic mirror 103, and then, the laser light L is condensed by the condensing lens 105 in the processing target 1 placed on the support base 107. At the same time, the stage 111 is moved, and the processing target 1 is moved relative to the laser light L along a line to cut 5. Thus, a modified region is formed in the processing target 1 along the line to cut 5. Here, the stage 111 is moved to move the laser light L relatively, but the condensing lens 105 may be moved, or both thereof may be moved.

Figure 2:
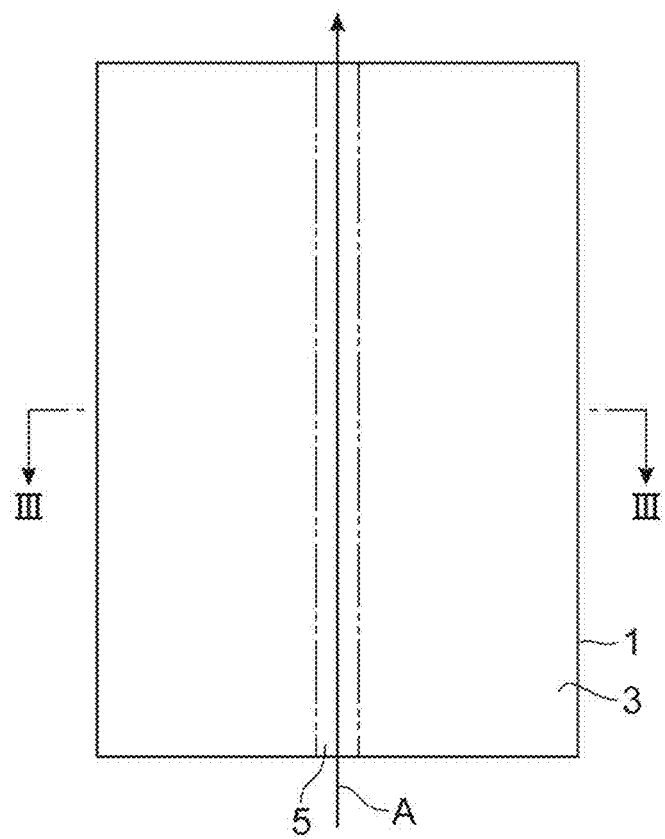
FIG. 2 is a plan view illustrating a processing target as a target of forming the modified region.
Figure 3:
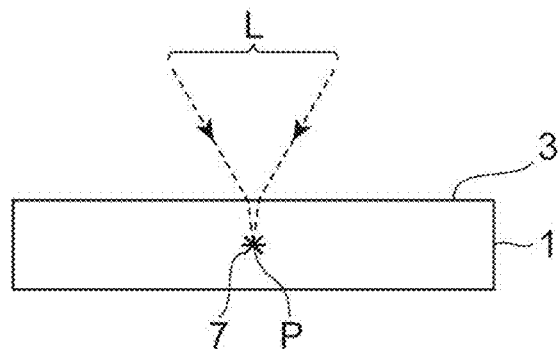
FIG. 3 is a sectional view of the processing target taken along line III-III in FIG. 2.
Figure 4:
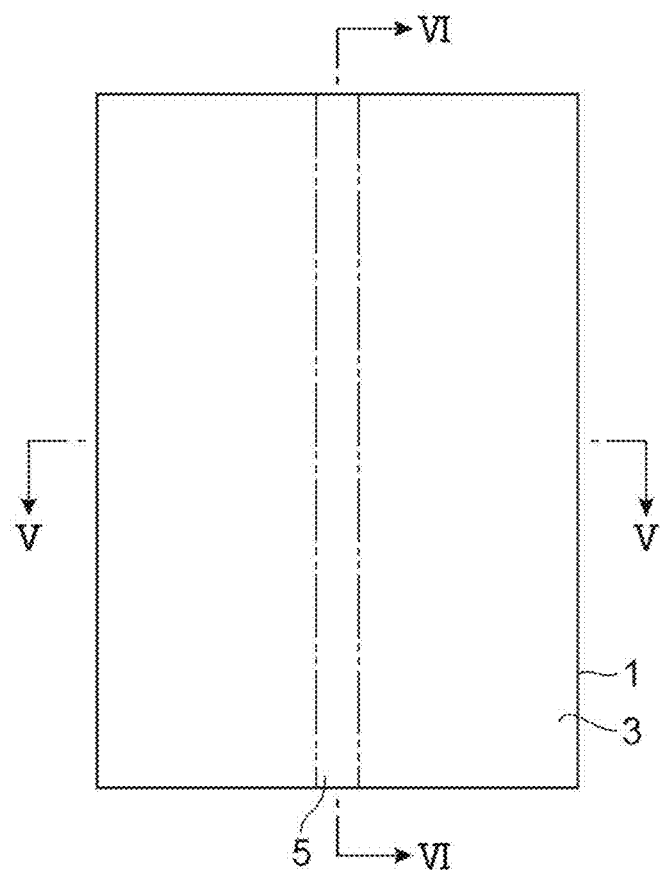
FIG. 4 is a plan view illustrating the processing target after laser processing.
Figure 5:
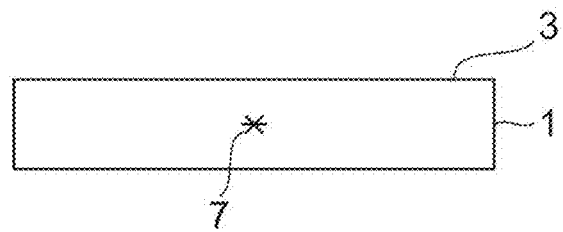
FIG. 5 is a sectional view of the processing target taken along line V-V in FIG. 4.
Figure 6:
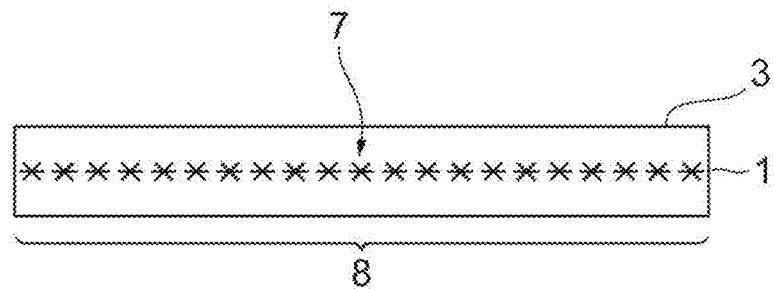
FIG. 6 is a sectional view of the processing target taken along line VI-VI in FIG. 4.

As the processing target 1, a plate-like member (for example, a substrate and a wafer) including a semiconductor substrate made of a semiconductor material, a piezoelectric substrate made of a piezoelectric material, or the like is used. As illustrated in FIG. 2, the line to cut 5 for cutting the processing target 1 is set on the processing target 1. The line to cut 5 is a virtual line extending in a straight line. In a case where the modified region is formed in the processing target 1, as illustrated in FIG. 3, the laser light L is relatively moved along the line to cut 5 (that is, in a direction indicated by an arrow A in FIG. 2) in a state where a focusing point (focusing position) P is aligned in the processing target 1. Thus, as illustrated in FIGS. 4 to 6, the modified region 7 is formed in the processing target 1 along the line to cut 5, and the modified region 7 formed along the line to cut 5 functions as a cutting start region 8.

The focusing point P is a location in which the laser light L is condensed. The line to cut 5 is not limited to a straight line and may be a curved line, a three-dimensional combination of the lines, or a coordinate designated. The line to cut 5 is not limited to a virtual line and may be a line actually drawn on the front surface 3 of the processing target 1. The modified region 7 may be formed continuously or intermittently. The modified region 7 may be in a form of a row or a dot. In short, the modified region 7 may be formed at least in the processing target 1. A fracture may be formed at a start point of the modified region 7. The fracture and the modified region 7 may be exposed to the outer surface (front surface 3, back surface, or outer circumferential surface) of the processing target 1. An incident surface of the laser light when the modified region 7 is formed is not limited to the front surface 3 of the processing target 1 and may be the back surface of the processing target 1.

In a case where the modified region 7 is formed in the processing target 1, the laser light L passes through the processing target 1 and is particularly absorbed in the vicinity of the focusing point P located in the processing target 1. Thus, the modified region 7 is formed in the processing target 1 (that is, internal absorption laser processing). In this case, since the laser light L is hardly absorbed by the front surface 3 of the processing target 1, the front surface 3 of the processing target 1 is not melted. In a case where the modified region 7 is formed on the front surface 3 of the processing target 1, the laser light L is particularly absorbed in the vicinity of the focusing point P located on the front surface 3. Thus, melting and removing are performed from the front surface 3, and a removal portion such as a hole or a groove is formed (surface absorption laser processing).

The modified region 7 is a region in which the density, refractive index, mechanical strength, and other physical characteristics are different from those of the surroundings. Examples of the modified region 7 include a melting treatment region (which means at least any one of a region which is solidified again after melting once, a region in a melted state, and a region in a state of being solidified again from melting), a crack region, a dielectric breakdown region, and a refractive index change region. In addition, a region in which the above regions are mixed is provided. Further, the modified region 7 includes a region in which, regarding the material of the processing target 1, the density in the modified region 7 is changed compared to the density in a non-modified region, or a region in which lattice defects are formed. In a case where the material of the processing target 1 is single crystal silicon, the modified region 7 may be referred to as a high dislocation density region.

Regarding the melting treatment region, the refractive index change region, the region in which the density in the modified region 7 is changed compared to the density in the non-modified region, and the region in which lattice defects are formed, a fracture (microcrack) may be included in these regions or at an interface between the modified region 7 and the non-modified region. The fracture to be included may be formed over the entire surface of the modified region 7 or may be formed only in a portion or in a plurality of portions. The processing target 1 includes a substrate made of a crystal material having a crystal structure. For example, the processing target 1 includes a substrate formed of at least any one of gallium nitride (GaN), silicon (Si), silicon carbide (SiC), $LiTaO_3$, and sapphire ($Al_2O_3$). In other words, for example, the processing target 1 includes a gallium nitride substrate, a silicon substrate, a SiC substrate, a $LiTaO_3$ substrate, or a sapphire substrate. The crystal material may be either anisotropic crystal or isotropic crystal. The processing target 1 may include a substrate made of an amorphous material having an amorphous structure, for example, a glass substrate.

In the embodiment, the modified region 7 may be formed by forming a plurality of modified spots (processing marks) along the line to cut 5. In this case, the modified region 7 is formed by collecting the plurality of modified spots. The modified spot is a modified portion formed by one pulse shot (that is, irradiation with one pulse laser: laser shot) of a pulsed laser light. Examples of the modified spot include a crack spot, a melting treatment spot, a refractive index change spot, or a mixture of at least one thereof. For the modified spot, considering the required cutting accuracy, required flatness of the cut surface, and the thickness, type, crystal orientation, and the like of the processing target 1, the size of the processing target 1 or the length of a fracture to be generated may be appropriately controlled. In the embodiment, the modified spot may be formed as the modified region 7, along the line to cut 5.

First Embodiment

An example of the laminated element manufacturing method according to a first embodiment will be described. In the manufacturing method, a laminated body in which a plurality of semiconductor wafers are laminated is obtained. Firstly, an example of the configuration of a laminated body and an example of a laminated element to be manufactured will be described.

Figure 7:
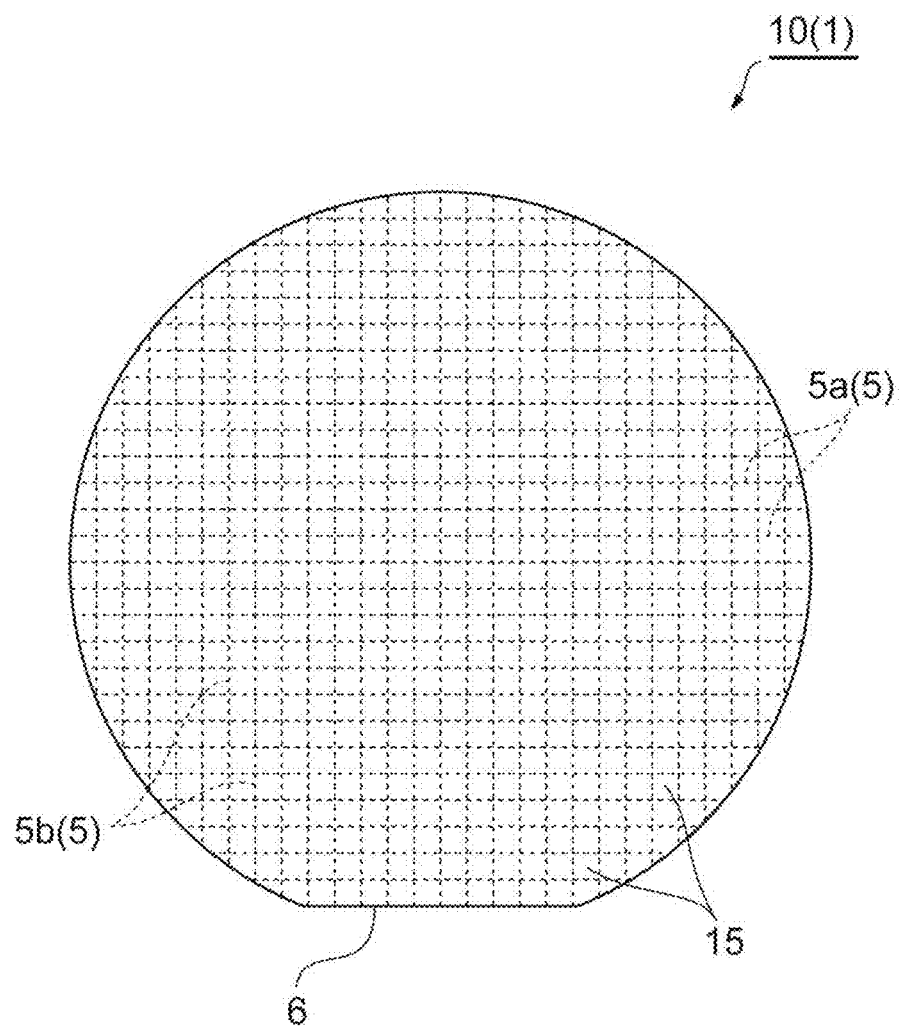
FIG. 7 is a plan view illustrating a laminated body as the processing target.
Figure 8:
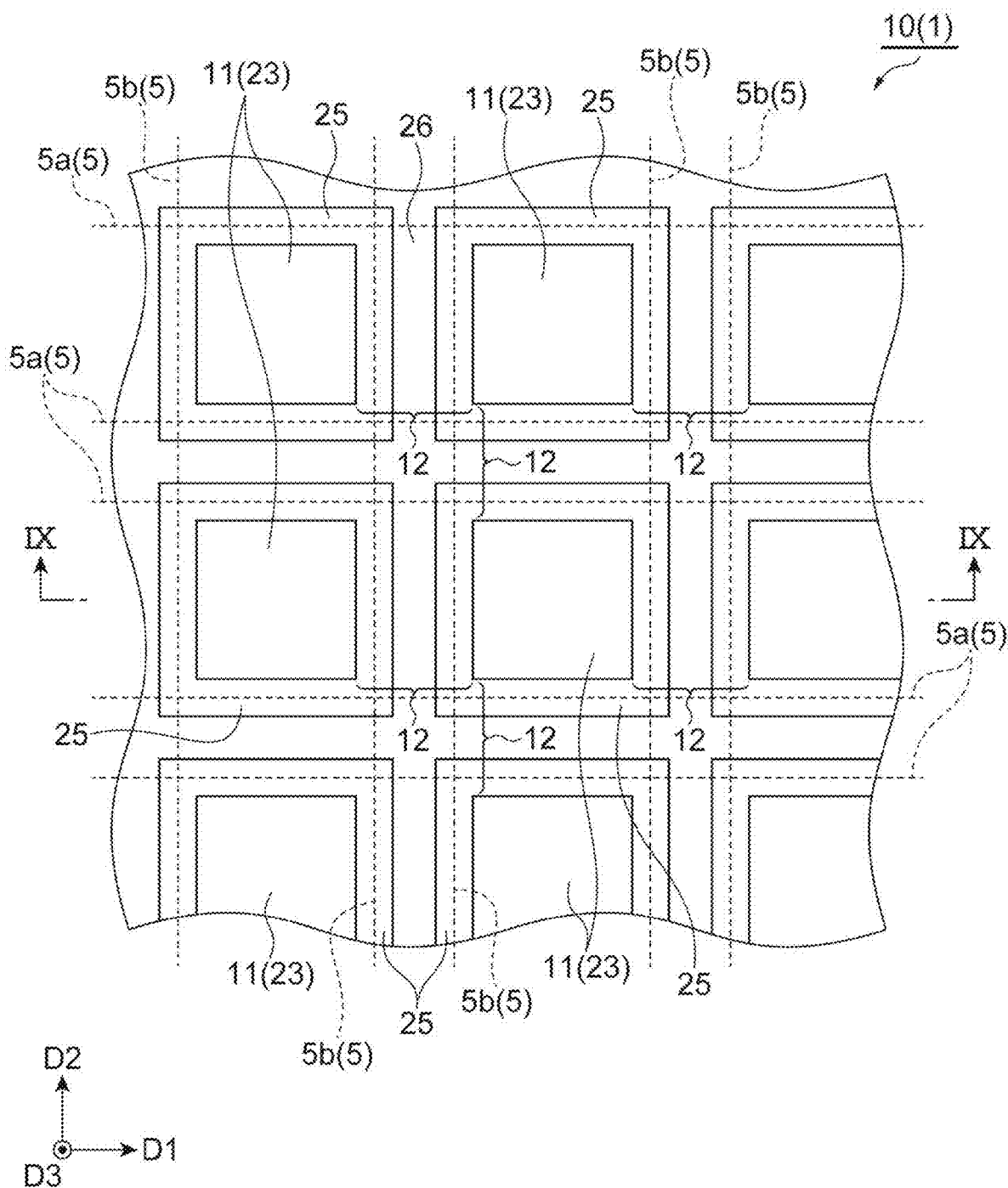
FIG. 8 is a schematic plan view illustrating an enlarged portion of the laminated body illustrated in FIG. 7.
Figure 9:
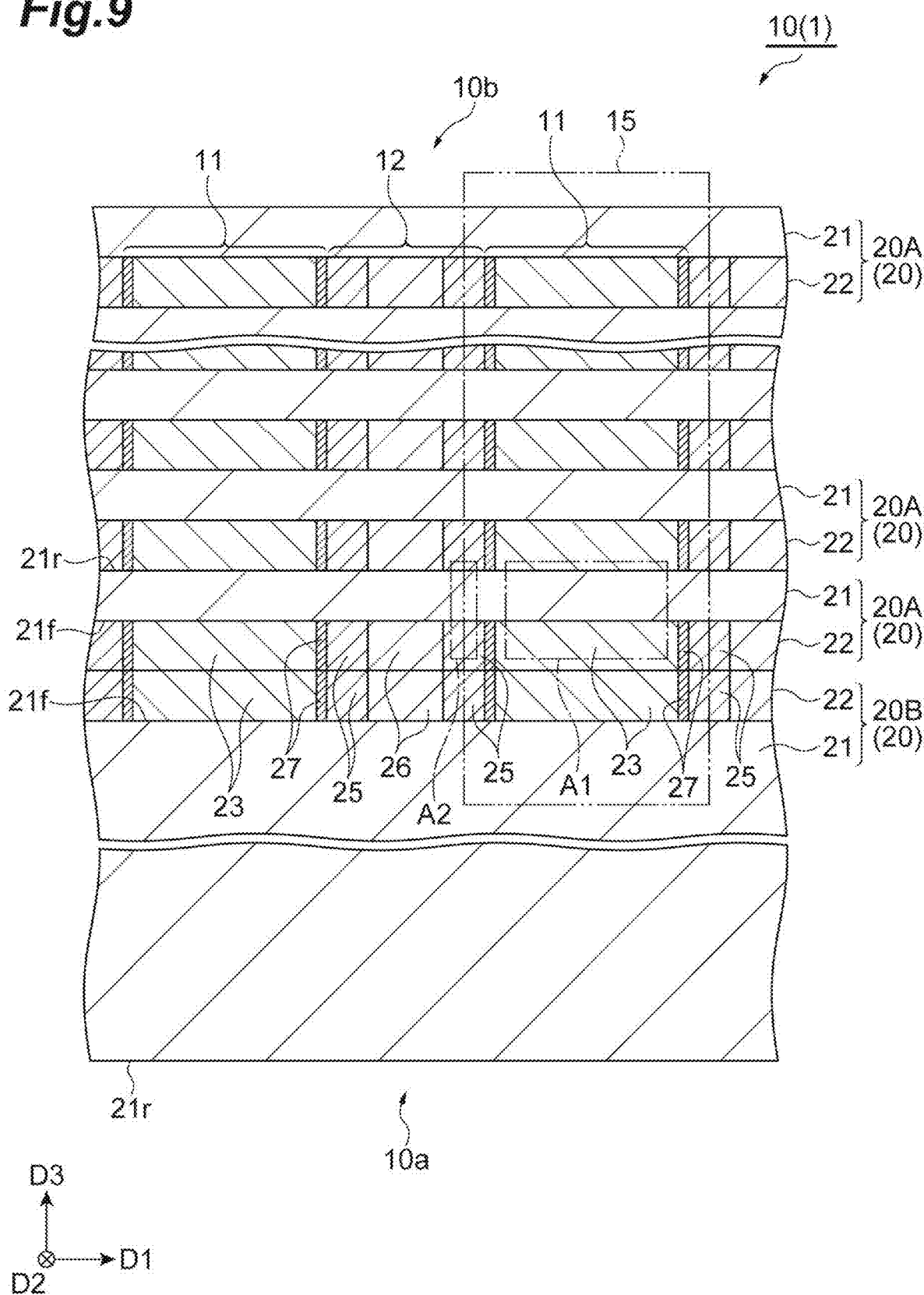
FIG. 9 is a schematic sectional view taken along line IX-IX in FIG. 8.

FIG. 7 is a plan view illustrating a laminated body as the processing target. FIG. 8 is a schematic plan view illustrating an enlarged portion of the laminated body illustrated in FIG. 7. FIG. 9 is a schematic sectional view taken along line IX-IX in FIG. 8. As illustrated in FIGS. 7 to 9, the laminated body 10 (processing target 1) includes an active region 11 and a cutting region 12. Active regions 11 are two-dimensionally arranged in a first direction D1 along an orientation flat 6 and a second direction D2 intersecting (orthogonal) with (to) the first direction D1. Cutting regions 12 are formed in a lattice shape to surround the active regions 11 when viewed from a third direction D3 intersecting (orthogonal) with (to) the first direction D1 and the second direction D2.

The laminated body 10 includes a plurality (here, ten) of semiconductor wafers 20 laminated on each other in the third direction D3. Each of the semiconductor wafers 20 includes a semiconductor substrate 21 and a circuit layer 22.

The semiconductor substrate 21 includes a front surface 21f and a back surface 21r. The circuit layer 22 is formed on the front surface 21f and includes a plurality of functional elements 23 two-dimensionally arranged along the front surface 21f. One active region 11 is set across all the semiconductor wafers 20 to include a plurality of (here, ten) functional elements 23 laminated in a line in the third direction D3. In the manufacturing method, each active region 11 is cut out by cutting the laminated body 10 in the cutting region 12.

Therefore, a line to cut 5a along the first direction D1 and a line to cut 5b along the second direction D2 are set as the above-described line to cut 5, in the laminated body 10. The lines to cut 5a and 5b are set in the cutting region 12 to pass between the functional elements 23 adjacent to each other in the first direction D1 and the second direction D2. More specifically, in the cutting region 12, a circular street portion 25 is provided in the circuit layer 22 to surround the functional element 23, and a lattice-like metal wiring portion 26 is provided to surround the functional element 23 and the street portion 25. The metal wiring portion 26 is, for example, a TEG wiring.

The line to cut 5a is set in the first direction D1 such that the line to cut 5a passes through the metal wiring portion 26 between street portions 25 which are adjacent to each other in the first direction D1, while passing through the street portion 25 between the functional elements 23 adjacent to each other in the second direction D2. Further, the line to cut 5b is set in the second direction D2 such that the line to cut 5b passes through the metal wiring portion 26 between street portions 25 which are adjacent to each other in the second direction D2, while passing through the street portion 25 between the functional elements 23 adjacent to each other in the first direction D1. Here, in the circuit layer 22, a metal guard ring 27 is provided between the functional element 23 and the street portion 25. In FIG. 8, the illustration of the semiconductor substrate 21 on the surface layer of the laminated body 10 is omitted.

Here, the laminated body 10 includes a semiconductor wafer 20A including a functional element 23 as a semiconductor memory described later, and a semiconductor wafer 20B including a functional element 23 as a driver IC of the semiconductor memory, as the semiconductor wafer 20. Here, the laminated body 10 has one end 10a and the other end 10b in the lamination direction (third direction D3), and only the semiconductor wafer 20 constituting the one end 10a is the semiconductor wafer 20B. The other semiconductor wafer 20 including the semiconductor wafer 20 constituting the other end 10b is the semiconductor wafer 20A.

Subsequently, the laminated element 15 will be described. The laminated element 15 is mainly manufactured in a manner that the active region 11 is cut out by cutting the laminated body 10 along the above-described lines to cut 5a and 5b. Therefore, each laminated element 15 includes a plurality of semiconductor substrates 21 and circuit layers 22 (the same as the number of semiconductor wafers 20 in the laminated body 10) laminated in a line. In the laminated element 15, one circuit layer 22 includes one functional element 23.

Therefore, the entirety of the laminated element 15 includes functional elements 23 of which the number is equal to the number of circuit layers 22. The functional elements 23 are electrically connected to each other, for example, through through electrodes (not illustrated) formed in the semiconductor substrate 21 and the circuit layer 22. The functional element 23 includes a functional element for a semiconductor memory such as a DRAM and a functional element for a driver IC of the semiconductor memory. The through electrode is formed by, for example, a through-silicon via (TSV) structure. The through electrode is used for supplying power to the functional element 23 and the like of each layer (for example, the semiconductor memory and the driver IC). The laminated element 15 further includes, for example, a circuit (not illustrated) for performing high-speed wireless communication by magnetic field transmission, and signals may be transmitted and received using the circuit.

Figure 10:
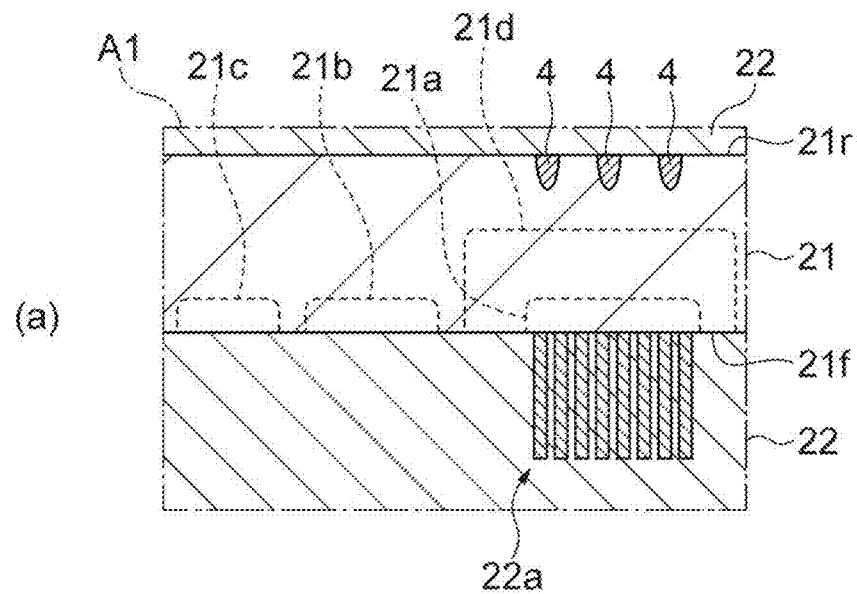
FIG. 10 is an enlarged view illustrating a partial region illustrated in FIG. 9.
Figure 10:
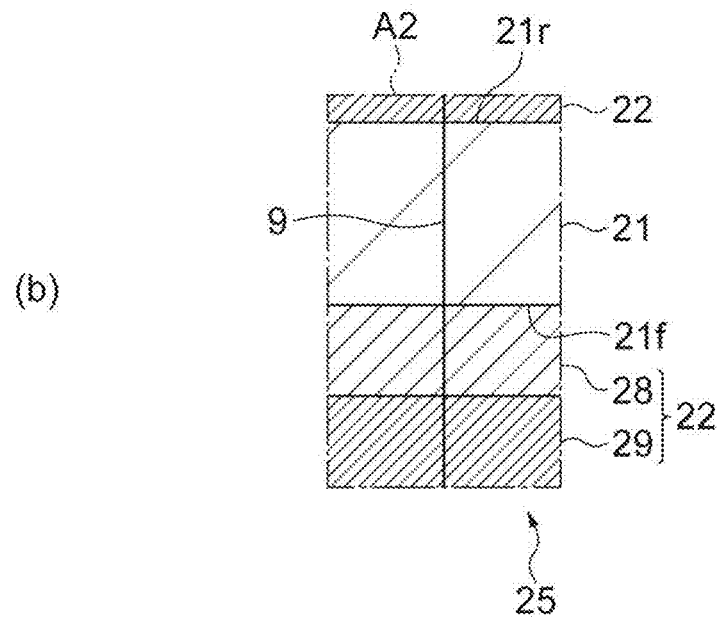

(a) of FIG. 10 is an enlarged view illustrating a region A1 in FIG. 9, and is an enlarged sectional view illustrating the circuit layer 22 including the functional element 23 for the semiconductor memory and the corresponding semiconductor substrate 21. (b) of FIG. 10 is an enlarged view illustrating a region A2 in FIG. 9, and is an enlarged sectional view illustrating the street portion 25 and the corresponding semiconductor substrate 21. As illustrated in (a) of FIG. 10, the functional element 23 includes a plurality of memory cells 22a. The memory cell 22a and a region around the memory cell 22a are configured by, for example, an interlayer insulating film such as a $SiO_2$ film, a wiring layer, and the like. First conductive type regions (for example, P-well) 21a and 21b expanding from the front surface 21f towards the back surface 22r, a second conductive type region (for example, N-well) 21c, and a second conductive type region (for example, Deep N-well) 21d expanding to surround the first conductive type region 21a are formed at a portion of the semiconductor substrate 21, which corresponds to the functional element 23. The first conductive type region 21a is formed at a position corresponding to the memory cell 22a. The semiconductor substrate 21 is, for example, a silicon substrate.

A gettering region 4 is formed at a portion of the semiconductor substrate 21, which corresponds to the functional element 23 (more specifically, a portion on the back surface 21r side with respect to the second conductive type region 21d among the portions), so as to be exposed to the back surface 21r. The gettering region 4 exhibits a gettering effect of collecting and capturing impurities such as heavy metals in the semiconductor substrate 2. The gettering region 4 is a region in which the semiconductor substrate 21 is reformed by irradiation with a laser light (region in which the density, refractive index, mechanical strength, and other physical characteristics are different from those in the surroundings). For example, the gettering region 4 is a melting processing region. The gettering region 4 may be formed continuously or intermittently so long as the gettering region 4 faces the functional element 23 (more specifically, the memory cell 22a).

As illustrated in (b) of FIG. 10, in the street portion 25, the circuit layer 22 includes insulating layers 28 and 29 which are sequentially laminated on the front surface 21f of the semiconductor substrate 21. The insulating layer 28 is made of for example, silicon oxide (for example, $SiO_2$). The insulating layer 29 is made of, for example, silicon nitride (for example, SiN). A fracture 9 is formed in the cutting region 12 along each of the lines to cut 5a and 5b. The dimension of the laminated element 15 in the first direction D1 is, for example, about 10 mm. The dimension of the laminated element 15 in the second direction D2 is, for example, about 10 mm. The dimension of the laminated element 15 in the third direction D3 is, for example, about 300 μm.

An example of the laminated element manufacturing method according to the first embodiment will be described.

Figure 11:
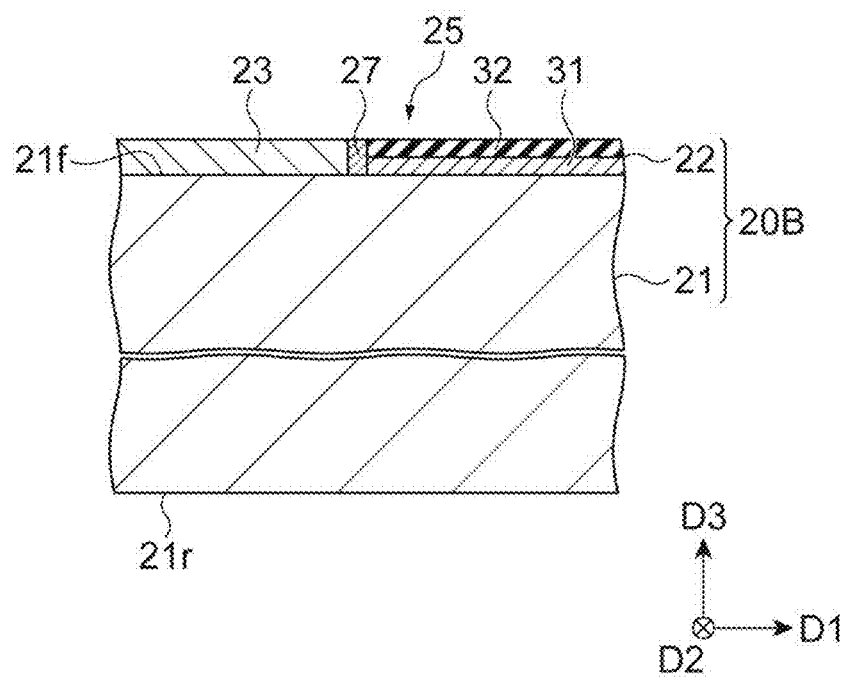
FIG. 11 is a diagram illustrating a main step of a laminated element manufacturing method according to a first embodiment.
Figure 11:
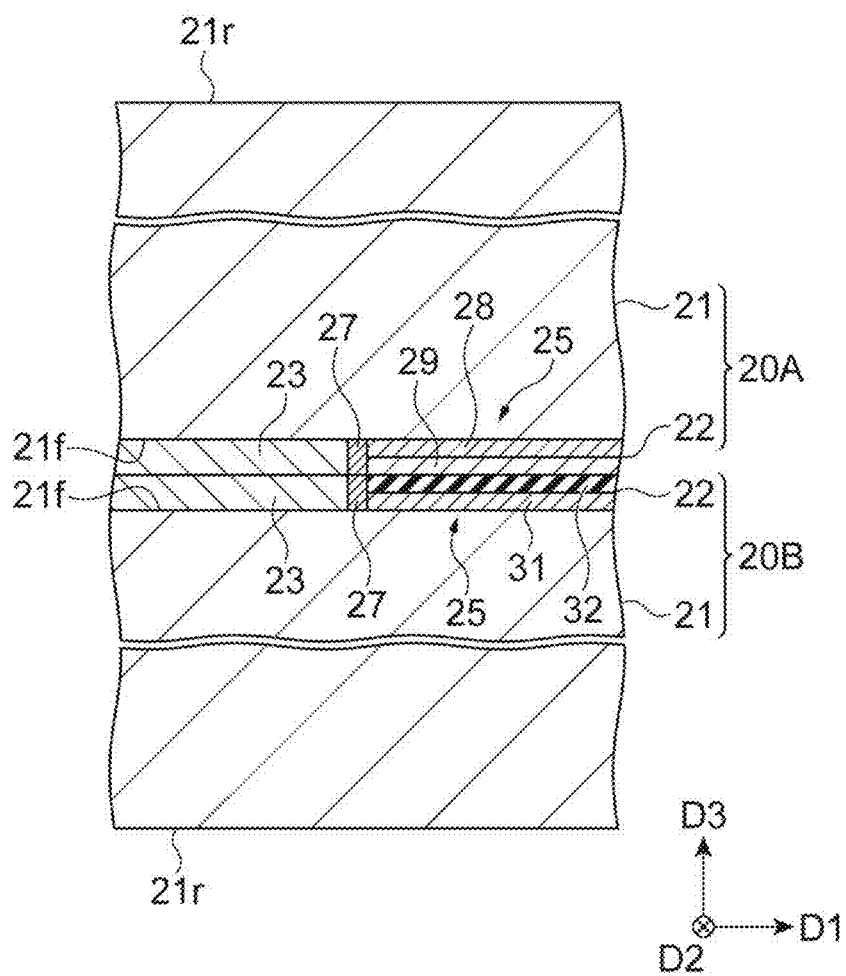

Firstly, as illustrated in (a) of FIG. 11, a semiconductor wafer 20B is prepared. The circuit layer 22 of the semiconductor wafer 20B includes the functional element 23 as a driver IC. The circuit layer 22 of the semiconductor wafer 20B includes insulating layers 31 and 32 which are sequentially laminated on the front surface 21f in the street portion 25.

The insulating layer 31 is made of, for example, silicon oxide (for example, $SiO_2$). The insulating layer 32 is, for example, a Black Diamond type Low-k film. The thickness of the semiconductor substrate 21 of the semiconductor wafer 20B is about 600 μm to 800 μm, for example. The thickness of the circuit layer 22 of the semiconductor wafer 20B is from 3 μm to 13 μm, for example.

Then, as illustrated in (b) of FIG. 11, the semiconductor wafer (first wafer) 20A is prepared. The circuit layer 22 of the semiconductor wafer 20A includes the functional element 23 as the semiconductor memory. The circuit layer 22 of the semiconductor wafer 20A includes the insulating layers 28 and 29 in the street portion 25. The thickness of the semiconductor substrate 21 of the semiconductor wafer 20A is about 600 μm to 800 μm, for example. The thickness of the circuit layer 22 of the semiconductor wafer 20A is from 3 μm to 13 μm, for example.

Then, the circuit layer 22 of the semiconductor wafer 20A is directly bonded to the circuit layer 22 of the semiconductor wafer 20B. At this time, the functional elements 23 of the semiconductor wafer 20B correspond to the functional elements 23 of the semiconductor wafer 20A in the third direction D3 intersecting with the front surface 21f and the back surface 21r, respectively. That is, each of the functional elements 23 of the semiconductor wafer 20B and each of the functional elements 23 of the semiconductor wafer 20A are arranged side by side in the third direction D3 (in other words, facing each other in the third direction D3). An example of direct bonding includes room temperature bonding.

Figure 12:
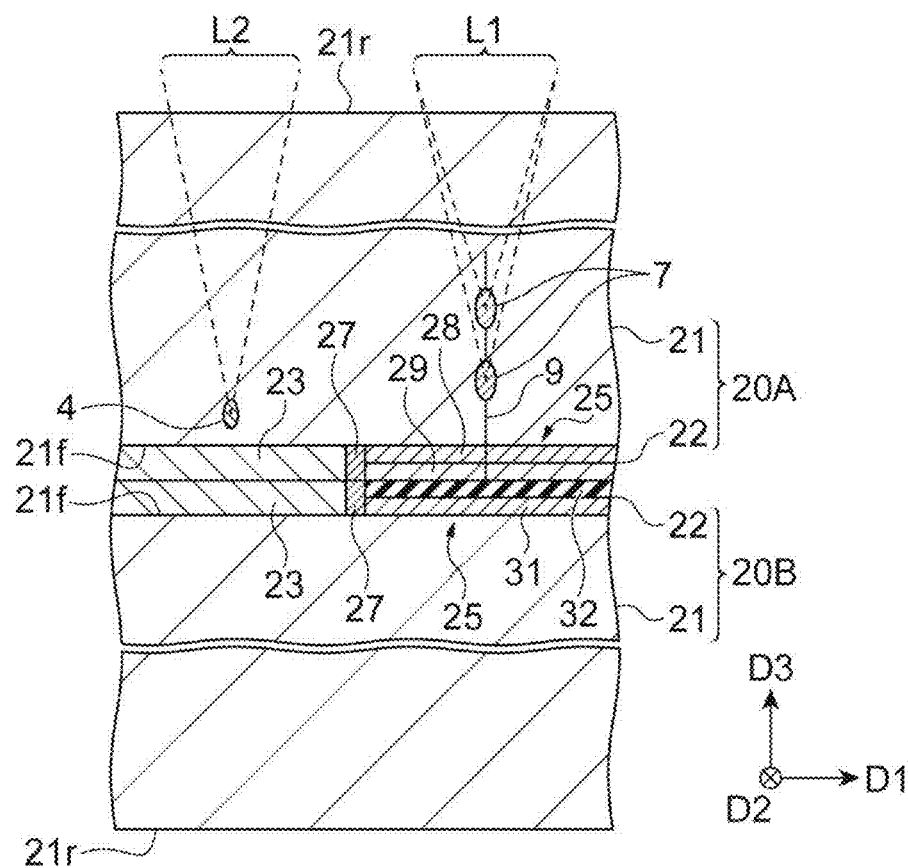
FIG. 12 is a diagram illustrating the main step of the laminated element manufacturing method according to the first embodiment.
Figure 12:
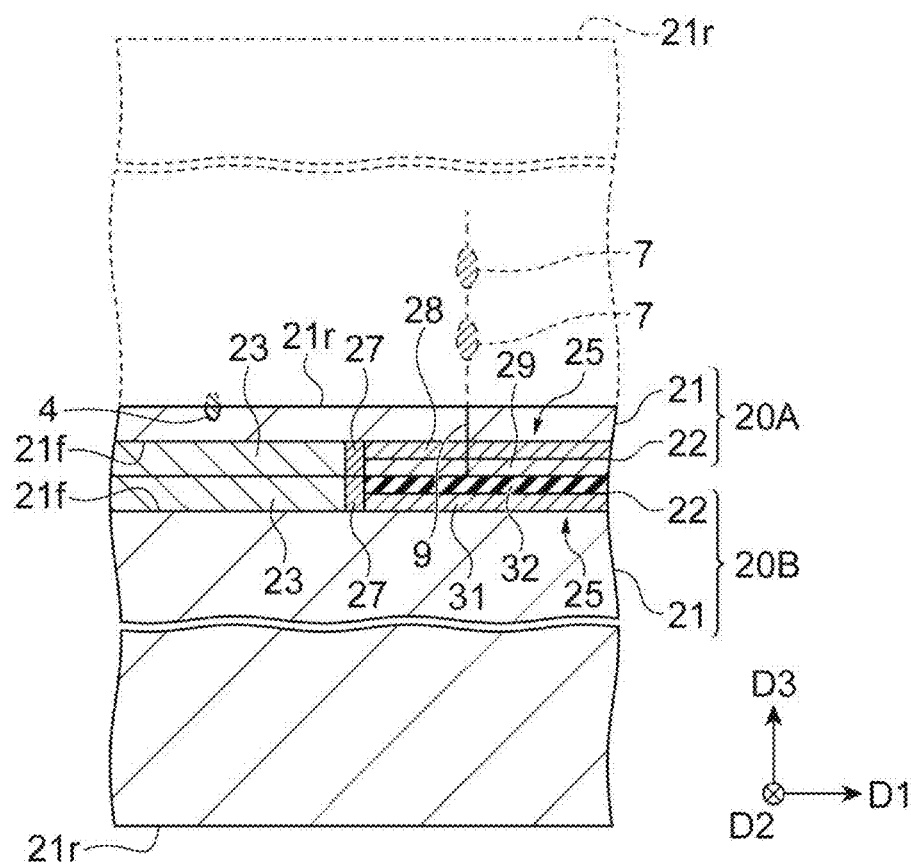

Then, as illustrated in (a) of FIG. 12, the semiconductor substrate 21 is irradiated with the laser light L1 along each of the lines to cut 5a and 5b by using the back surface 21r of the semiconductor substrate 21 of the semiconductor wafer 20A as an incident surface of the laser light L1, and thus a modified region (first modified region) 7 is formed along each of the lines to cut 5a and 5b in the semiconductor substrate 21. In addition, a fracture (first fracture) 9 extending from the modified region 7 toward the circuit layer 22 of the semiconductor wafer 20A is formed in the semiconductor substrate 21 (first forming step). Here, the fracture 9 is formed to reach at least the interface between the circuit layer 22 of the semiconductor wafer 20B and the circuit layer 22 of the semiconductor wafer 20A (that is, the directly bonded interface). Since the semiconductor substrate 21 of the semiconductor wafer 20B functions as a support substrate, the fracture 9 is formed so as not to reach the semiconductor substrate 21 of the semiconductor wafer 20B. Further, the semiconductor substrate 21 is irradiated with a laser light L2 by using the back surface 21r of the semiconductor substrate 21 of the semiconductor wafer 20A as an incident surface of the laser light L1, so as to correspond to each functional element 23. Thereby, a gettering region (first gettering region) 4 is formed in the semiconductor substrate 21 for each functional element 23 (first forming step). Either of forming the modified region 7 and forming the gettering region 4 may be performed firstly. Forming the modified region 7 and forming the gettering region 4 may be performed simultaneously.

The modified region 7 and the gettering region 4 may be formed in the same step by using a laser processing device capable of changing the pulse width, for example, a fiber laser having an oscillation wavelength of 1099 nm. As an example, the pulse width of the laser light L2 for forming the gettering region 4 is set to be smaller than the pulse width of the laser light L1 for forming the modified region 7, for example, the pulse width of the laser light L1 for forming the modified region 7 is set to 700 ns, and the pulse width of the laser light L2 for forming the gettering region 4 is set to 20 ns. Thus, it is possible to form the gettering region 4 which has a size smaller than that of the modified region 7 and in which fractures are generated less than fractures in the modified region 7.

A specific example of an irradiation condition of the laser light L1 for forming the modified region 7 is as follows. With the irradiation condition, it is possible to suppress an occurrence of a situation in which the circuit layer 22 is damaged by a leakage light of the laser light L1. So long as a desired fracture 9 can be generated from the modified region 7, the number of lines of the modified regions 7 formed along each of the lines to cut 5a and 5b (number of lines of the modified regions 7 arranged in the third direction D3) may be plural or one.

Wavelength: to 1170 nm
Pulse width: 350 ns or more
Pulse energy: 10 µJ or more
Pulse pitch: 6.5 to 15 µm
Distance between the modified region 7 on the circuit layer 22 side and the front surface 21f: 40 µm or more
Number of times of scanning of each of the lines to cut 5a and 5b with the laser light L1: once in bifocal branch A specific example of an irradiation condition of the laser light L2 for forming the gettering region 4 is as follows. Thus, the gettering region 4 having a width of about 1 to 4 µm in an incident direction of the laser light L2 can be formed.

Wavelength: 1064 to 1170 nm
Pulse width: 1 to 60 ns
Pulse energy: 0.1 to 0.5 µJ

Then, as illustrated in (b) of FIG. 12, the semiconductor substrate 21 of the semiconductor wafer 20A on which the modified region 7 and the gettering region 4 are formed is ground (first grinding step). At this time, the modified region 7 is removed, and the fracture 9 is exposed to the back surface 21r of the semiconductor substrate 21 of the semiconductor wafer 20A. Further, a portion of the gettering region 4 is removed. Here, the semiconductor substrate 21 is ground from the back surface 21r side, and thus the semiconductor substrate 21 (that is, the semiconductor wafer 20A) is thinned. Here, for example, the semiconductor substrate 21 is ground such that the thickness of the semiconductor substrate 21 is about from 3 µm to 13 µm (as an example, the thickness is substantially equal to the thickness of the circuit layer 22). Thus, the total thickness of the semiconductor wafer 20A is set to, for example, about 6 µm to 26 µm. The new back surface 21r formed by the grinding is flat enough to allow direct bonding (as an example, the back surface is mirrored).

Figure 13:
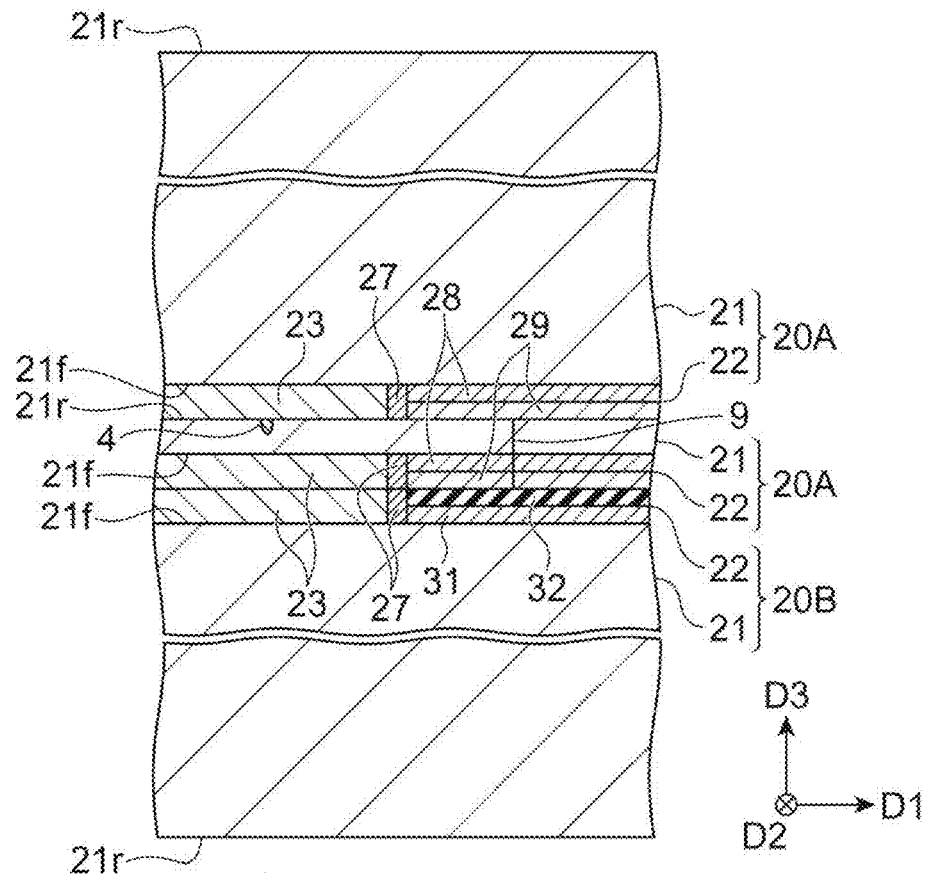
FIG. 13 is a diagram illustrating the main step of the laminated element manufacturing method according to the first embodiment.
Figure 13:
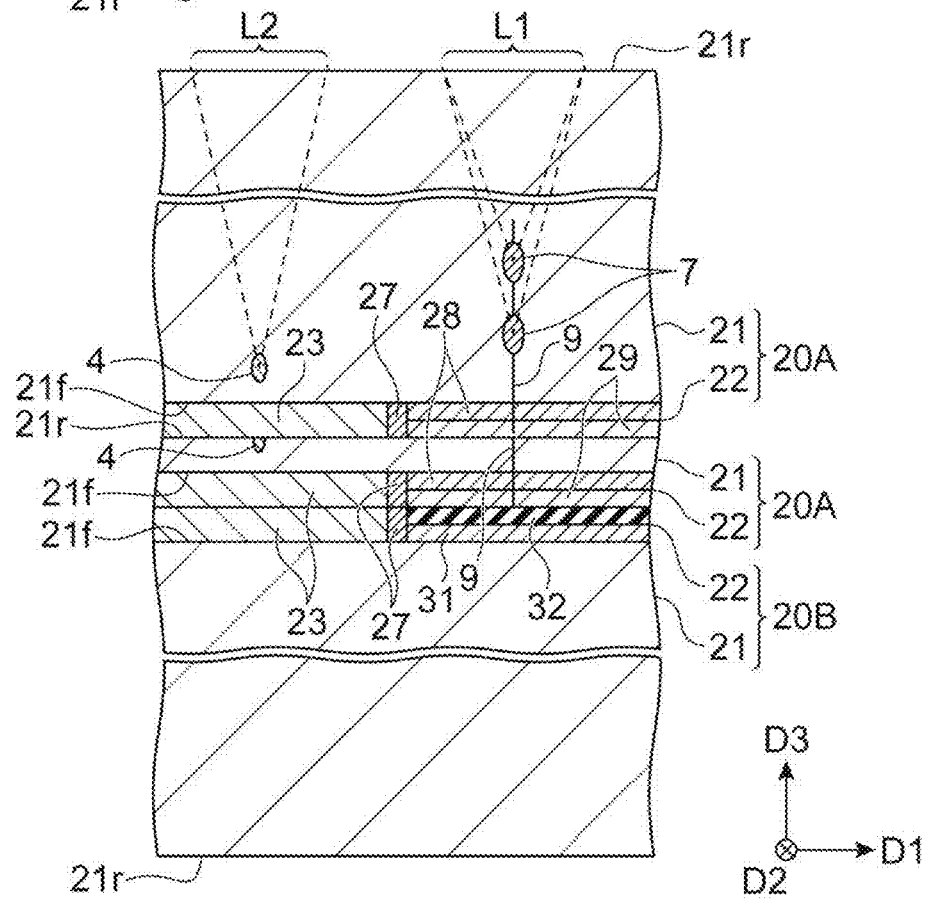

Then, as illustrated in (a) of FIG. 13, a new semiconductor wafer (second wafer) 20A is prepared, and the circuit layer 22 of the new semiconductor wafer 20A is directly bonded to the semiconductor substrate 21 of the ground semiconductor wafer 20A (bonding step). At this time, the functional elements 23 of the ground semiconductor wafer 20A correspond to the functional elements 23 of the new semiconductor wafer 20A in the third direction D3, respectively.

Then, as illustrated in (b) of FIG. 13, the semiconductor substrate 21 is irradiated with the laser light L1 along each of the lines to cut 5a and 5b by using the back surface 21r of the semiconductor substrate 21 of the new semiconductor wafer 20A as an incident surface of the laser light L1, and thus a modified region (second modified region) 7 is formed along each of the lines to cut 5a and 5b in the semiconductor substrate 21. In addition, a fracture (second fracture) 9 extending from the modified region 7 toward the circuit layer 22 of the new semiconductor wafer 20A is formed in the semiconductor substrate 21 (second forming step). Here, the fracture 9 is formed to reach at least the interface between the semiconductor substrate 21 of the ground semiconductor wafer 20A and the circuit layer 22 of the new semiconductor wafer 20A (that is, the directly bonded interface). Further, the semiconductor substrate 21 is irradiated with a laser light L2 by using the back surface 21r of the semiconductor substrate 21 of the new semiconductor wafer 20A as an incident surface of the laser light L1, so as to correspond to each functional element 23. Thereby, a gettering region (second gettering region) 4 is formed in the semiconductor substrate 21 for each functional element 23 (second forming step). The irradiation condition for each of the laser light L1 and the laser light L2 is as described above. Either of forming the modified region 7 and forming the gettering region 4 may be performed firstly. Forming the modified region 7 and forming the gettering region 4 may be performed simultaneously.

Figure 14:
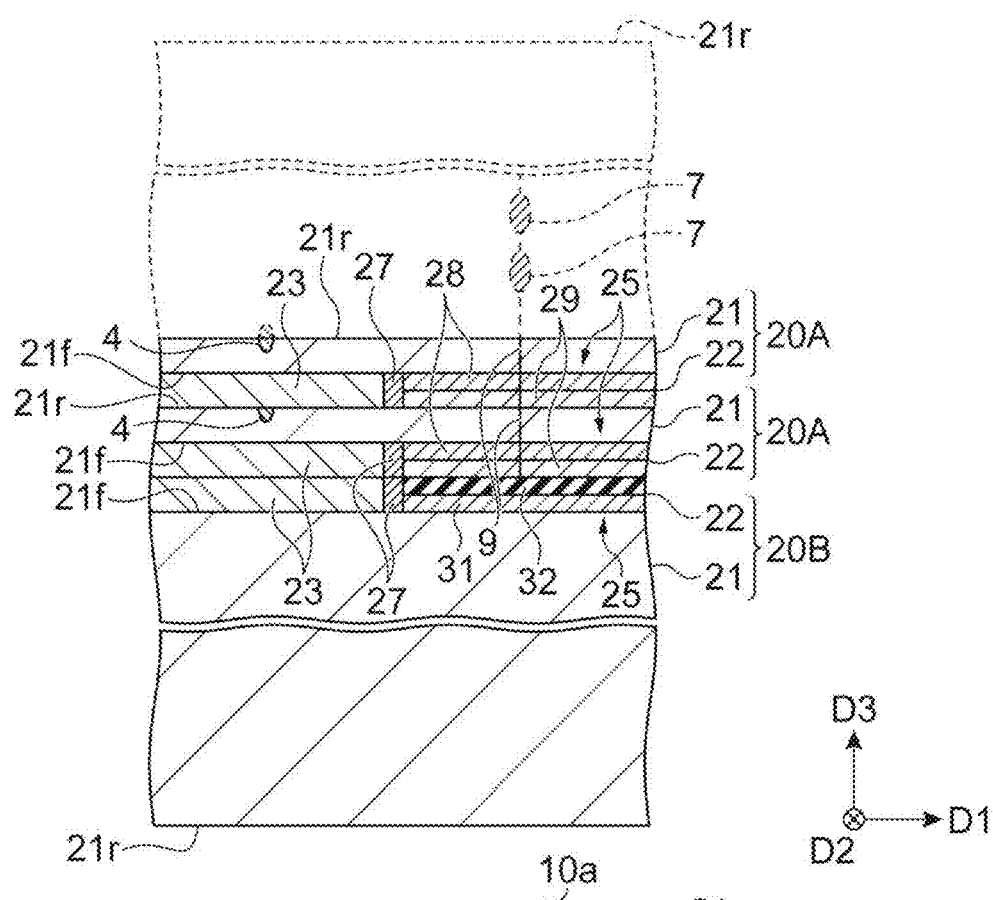
FIG. 14 is a diagram illustrating the main step of the laminated element manufacturing method according to the first embodiment.
Figure 14:
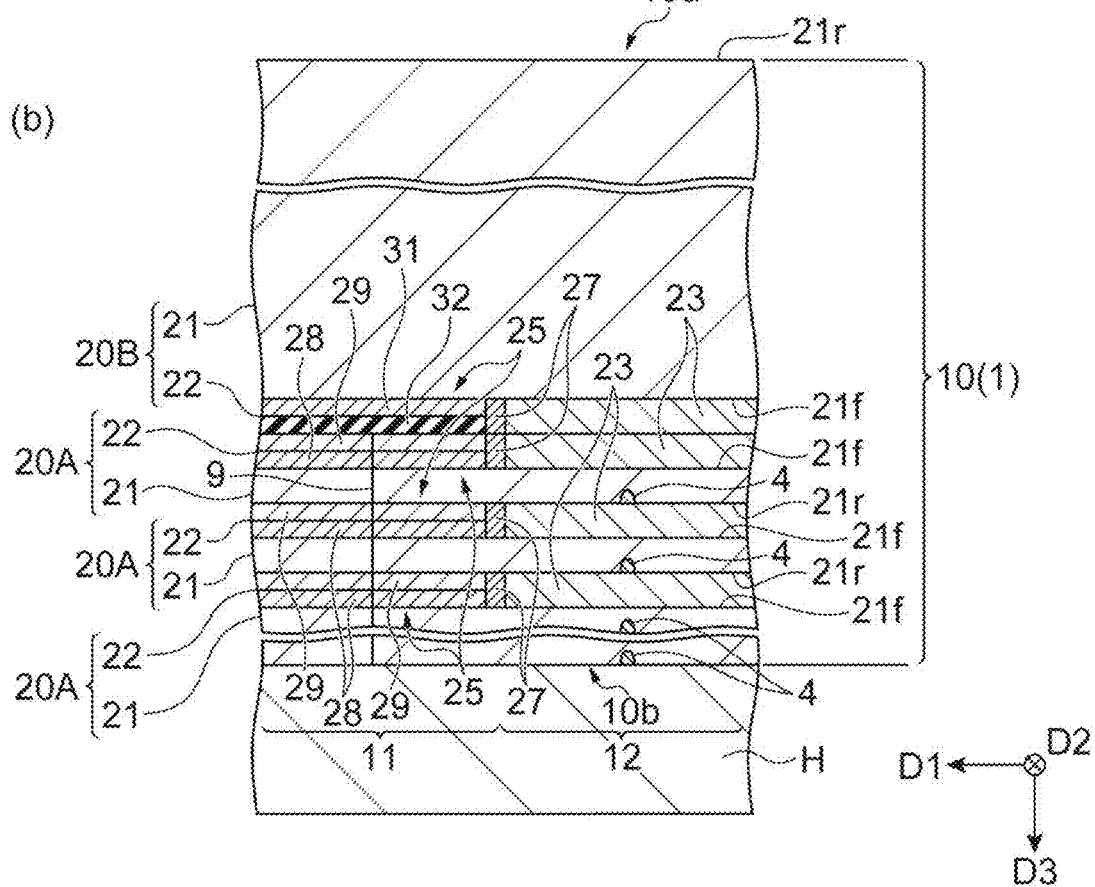

Then, as illustrated in (a) of FIG. 14, the semiconductor substrate 21 of the semiconductor wafer 20A on which the modified region 7 and the gettering region 4 are formed is ground (second grinding step). At this time, the modified region 7 is removed, and the fracture 9 is exposed to the back surface 21r of the semiconductor substrate 21 of the semiconductor wafer 20A. Further, a portion of the gettering region 4 is removed. Here, the semiconductor substrate 21 is ground from the back surface 21r side, and thus the semiconductor substrate 21 (that is, the semiconductor wafer 20A) is thinned. Here, for example, the semiconductor substrate 21 is ground such that the thickness of the semiconductor substrate 21 is about from 3 µm to 13 µm (as an example, the thickness is substantially equal to the thickness of the circuit layer 22). Thus, the total thickness of the semiconductor wafer 20A is set to, for example, about 6 µm to 26 µm. The new back surface 21r formed by the grinding is flat enough to allow direct bonding (as an example, the back surface is mirrored).

Then, as illustrated in (b) of FIG. 14, the laminated body 10 is configured by repeating a flow of directly bonding the new semiconductor wafer 20A to the ground semiconductor wafer 20A, forming the modified region 7 and the gettering region 4 in the new semiconductor wafer 20A, and grinding the new semiconductor wafer 20A. Thus, for example, one semiconductor wafer 20B including the functional element 23 as the driver IC and a plurality (here, nine) of semiconductor wafers 20A including the functional element 23 as the semiconductor memory are laminated, and thereby a laminated body 10 configured with a plurality (here, ten) of semiconductor wafers 20 is obtained.

In (b) of FIG. 14, the laminated body 10 obtained as described above is held by a holder H in an inverted state. That is, here, it is desired that the other end 10b of the laminated body 10 is directed toward the holder H, and the semiconductor wafer 20A including the one end 10a is most on the opposite side of the holder H. Thus, the back surface 21r of the semiconductor substrate 21 is exposed. In descriptions of the subsequent steps, descriptions of the laminated structure of the laminated body 10 will be omitted, and the active region 11 and the cutting region 12 will be representatively illustrated.

Figure 15:
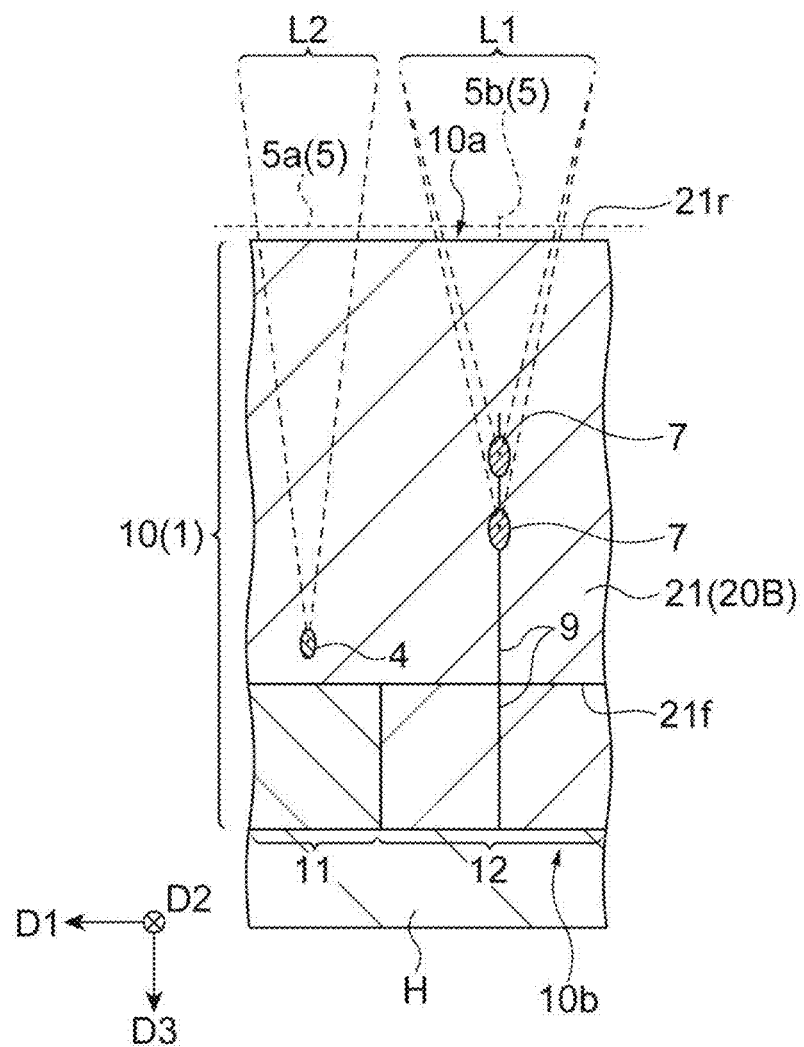
FIG. 15 is a diagram illustrating the main step of the laminated element manufacturing method according to the first embodiment

Then, as illustrated in FIG. 15, the semiconductor substrate 21 is irradiated with the laser light L1 along each of the lines to cut 5a and 5b by using the back surface 21r of the semiconductor substrate 21 of the semiconductor wafer 20B as an incident surface of the laser light L1, and thus a modified region 7 is formed along each of the lines to cut 5a and 5b in the semiconductor substrate 21. In addition, a fracture 9 extending from the modified region 7 toward the circuit layer 22 of the semiconductor wafer 20B is formed in the semiconductor substrate 21. Here, the fracture 9 is formed to reach at least the interface between the circuit layer 22 of the semiconductor wafer 20A and the circuit layer 22 of the semiconductor wafer 20B (that is, the directly bonded interface). Thus, the fracture 9 continues to the back surface 21r of the semiconductor substrate 21 of the semiconductor wafer 20A, which is located closest to the holder H along each of the lines to cut 5a and 5b. Further, the semiconductor substrate 21 is irradiated with a laser light L2 by using the back surface 21r of the semiconductor substrate 21 of the semiconductor wafer 20B as an incident surface of the laser light L1, so as to correspond to each functional element 23 (that is, each functional element 23 as the driver IC). Thereby, the gettering region 4 is formed in the semiconductor substrate 21 for each functional element 23. The irradiation condition for each of the laser light L1 and the laser light L2 is as described above. Either of forming the modified region 7 and forming the gettering region 4 may be performed firstly. Forming the modified region 7 and forming the gettering region 4 may be performed simultaneously.

Figure 16:
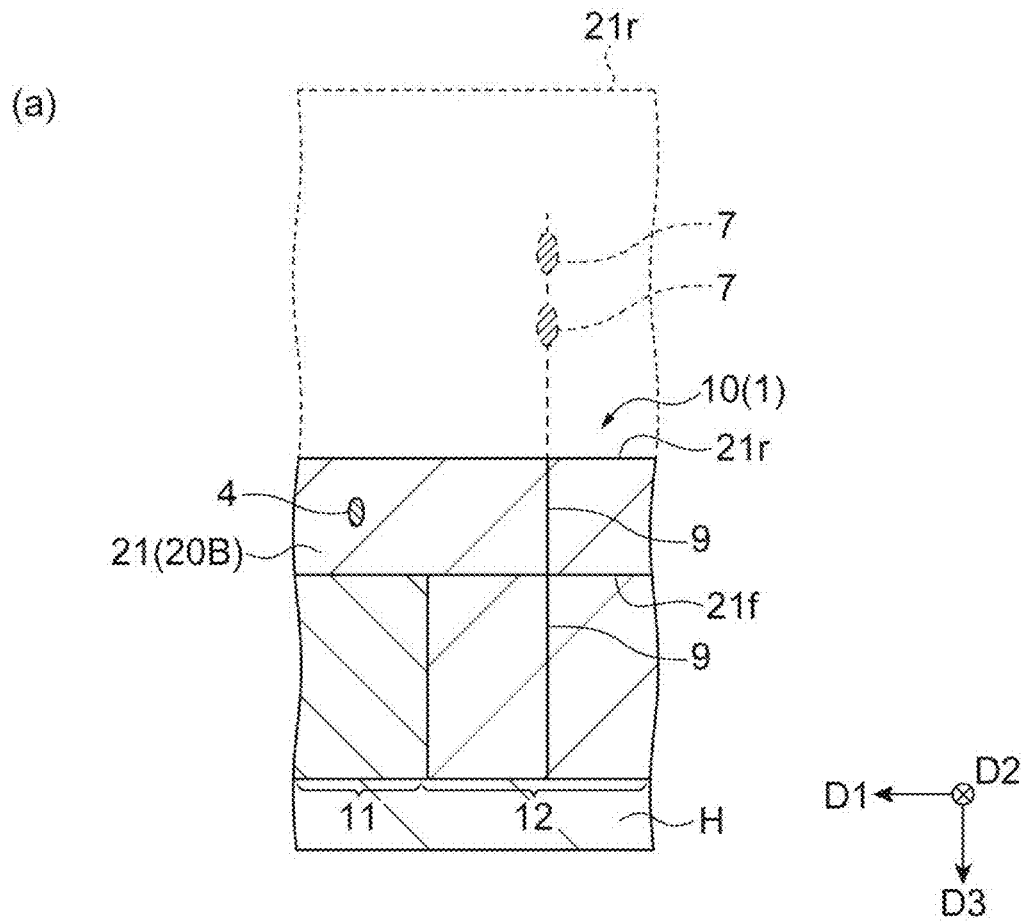
FIG. 16 is a diagram illustrating the main step of the laminated element manufacturing method according to the first embodiment.
Figure 16:
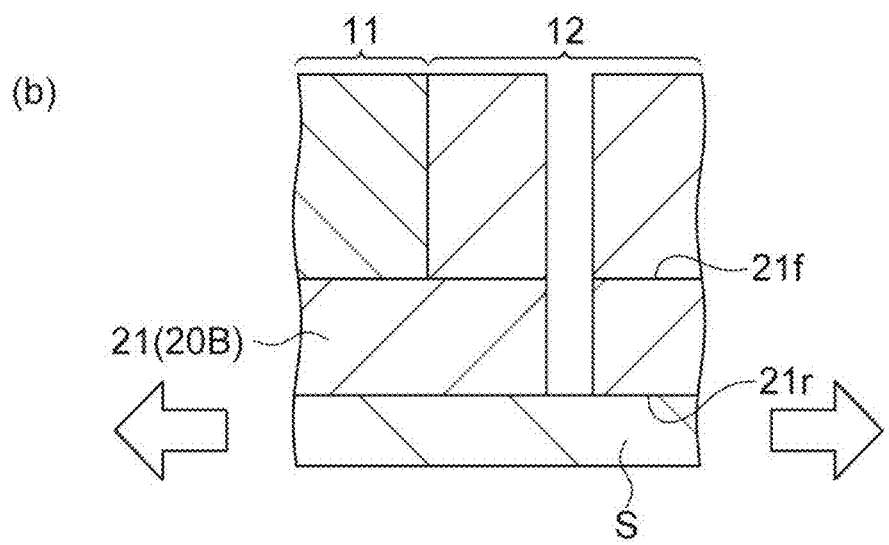

Then, as illustrated in (a) of FIG. 16, the semiconductor substrate 21 of the semiconductor wafer 20B on which the modified region 7 and the gettering region 4 are formed is ground. At this time, the modified region 7 is removed, and the fracture 9 is exposed to the back surface 21r of the semiconductor substrate 21 of the semiconductor wafer 20B. The gettering region 4 remains. Here, the semiconductor substrate 21 is ground from the back surface 21r side, and thus the semiconductor substrate 21 (that is, the semiconductor wafer 20B) is thinned. Here, for example, the semiconductor substrate 21 of the semiconductor wafer 20B is ground such that the thickness of the semiconductor substrate 21 is about 200 μm. The reason that the semiconductor substrate 21 of the semiconductor wafer 20B is left to be thicker than that in the other semiconductor substrates 21 is that the semiconductor substrate 21 of the semiconductor wafer 20B serves as the support substrate in the laminated element 15.

Then, as illustrated in (b) of FIG. 16, the laminated body 10 is in a state of being supported by an expandable support member S such as an expanded tape. At this time, the back surface 21r of the semiconductor substrate 21 of the semiconductor wafer 20B is disposed on the support member S side. In this state, if the support member S is expanded, the plurality of laminated elements 15 obtained by cutting the laminated body 10 along each of the lines to cut 5a and 5b are separated from each other, and each laminated element 15 is picked up (pick-up step).

As described above, in the laminated element manufacturing method according to the first embodiment, it is possible to obtain the laminated body 10 in which the plurality of semiconductor wafers 20A are laminated in a state where each semiconductor substrate 21 is thinned, by repeating a flow of grinding the semiconductor substrate 21 of the semiconductor wafer 20A, directly bonding the circuit layer 22 of the new semiconductor wafer 20A to the semiconductor substrate 21 of the semiconductor wafer 20A, and grinding the semiconductor substrate 21 of the new semiconductor wafer 20A. In addition, since the modified region 7 is formed in each semiconductor substrate 21 before the semiconductor substrate 21 is ground, it is possible to obtain a laminated body 10 in which the modified region 7 is formed in each semiconductor substrate 21. Here, if blade dicing is used for cutting the laminated body 10 as described above, the yield is significantly reduced by chipping at a bonding interface of the semiconductor wafer 20A. On the contrary, in the laminated element manufacturing method according to the first embodiment, since the fracture 9 extends from the modified region 7 formed in each semiconductor substrate 21, it is possible to cut the laminated body 10 while suppressing an occurrence of chipping at the bonding interface of the semiconductor wafer 20A. Thus, according to the laminated element manufacturing method according to the first embodiment, it is possible to achieve both thinning of the laminated element 15 and improvement of the yield.

Further, in the laminated element manufacturing method according to the first embodiment, when the modified region 7 is formed in each semiconductor substrate 21, the fracture 9 extending from the modified region 7 toward the circuit layer 22 is formed. In particular, in the laminated element manufacturing method according to the first embodiment, when the modified region 7 is formed in each semiconductor substrate 21, the fracture 9 is formed to reach the interface between the semiconductor substrate 21 and the circuit layer 22 which are directly bonded to each other. Thus, it is possible to more easily cut the laminated body 10 along each of the lines to cut 5a and 5b with higher accuracy.

Further, in the laminated element manufacturing method according to the first embodiment, when each semiconductor substrate 21 is ground, the modified region 7 is removed, and the fracture 9 is exposed to the back surface 21r of the semiconductor substrate 21. Accordingly, since the modified region 7 does not remain on the cut surface of the manufactured laminated element 15, it is possible to suppress degradation of flexural strength of the laminated element 15.

Further, in the laminated element manufacturing method according to the first embodiment, the plurality of laminated elements 15 obtained by cutting the laminated body 10 along each of the lines to cut 5a and 5b are picked up. Thus, it is possible to obtain the laminated element 15 with high efficiency.

Further, in the laminated element manufacturing method according to the first embodiment, since the gettering region 4 is formed in each semiconductor substrate 21 before each semiconductor substrate 21 is ground, and the portion of the gettering region 4 is removed when each semiconductor substrate 21 is ground, it is possible to form an appropriate gettering region 4 in the thinned semiconductor substrate 21. Thus, according to the laminated element manufacturing method according to the first embodiment, it is possible to achieve both thinning of the laminated element 15 and forming the appropriate gettering region 4.

Further, in the laminated element manufacturing method according to the first embodiment, the pulse width of the laser light L2 for forming the gettering region 4 is smaller than the pulse width of the laser light L1 for forming the modified region 7. Thus, it is possible to suppress extension of the fracture from the gettering region 4 and to accelerate extension of the fracture 9 from the modified region 7.

Second Embodiment

Figure 17:
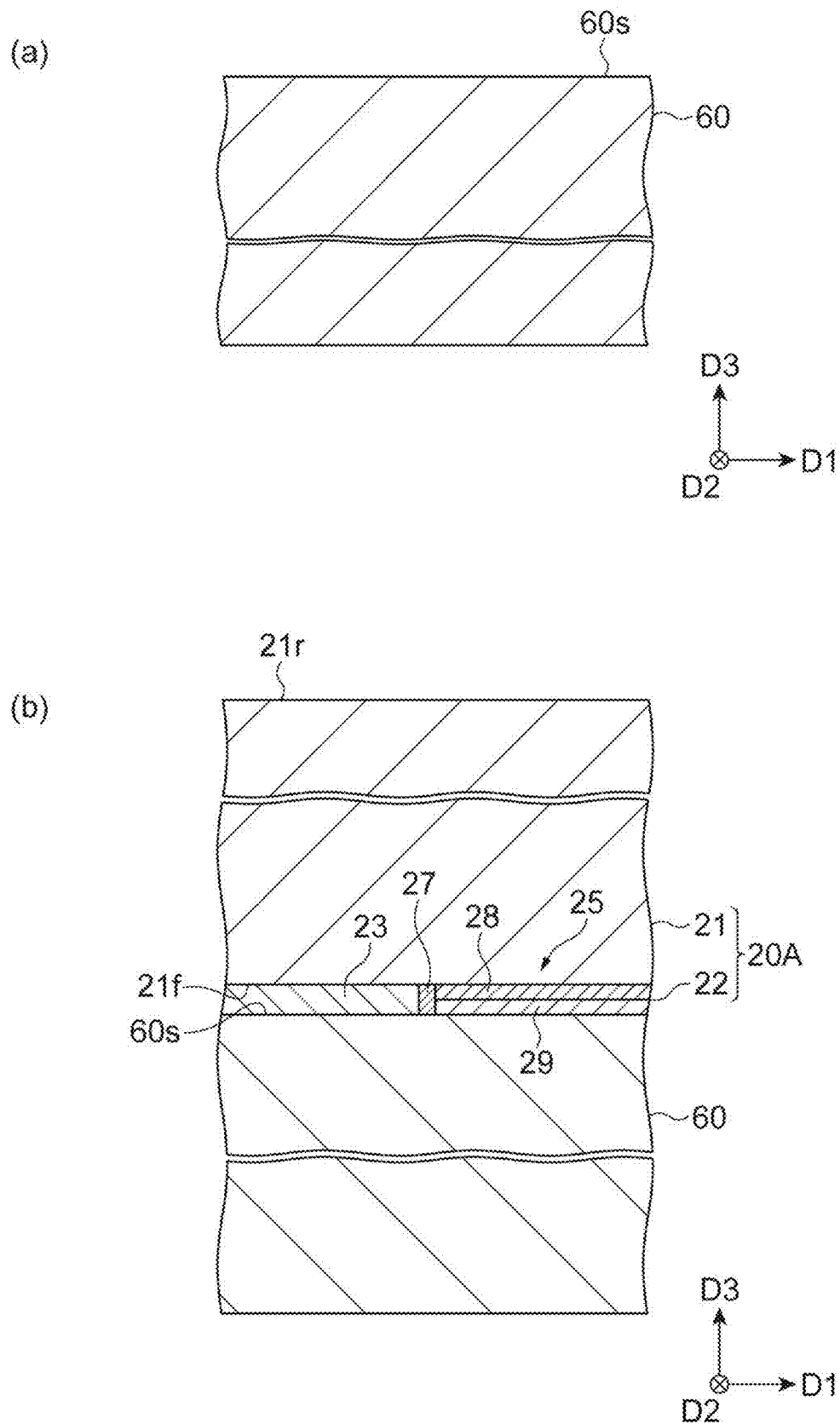
FIG. 17 is a diagram illustrating a main step of a laminated element manufacturing method according to a second embodiment.

An example of a laminated element manufacturing method according to a second embodiment will be described. Here, firstly, as illustrated in (a) of FIG. 17, a support substrate 60 is prepared. As the support substrate 60, any substrate such as a glass substrate and a semiconductor substrate is provided. Then, as illustrated in (b) of FIG. 17, a semiconductor wafer (first wafer) 20A is prepared. Then, a circuit layer 22 of the semiconductor wafer 20A is bonded to a front surface 60s of the support substrate 60. For example, resin bonding may be used for this bonding.

Figure 18:
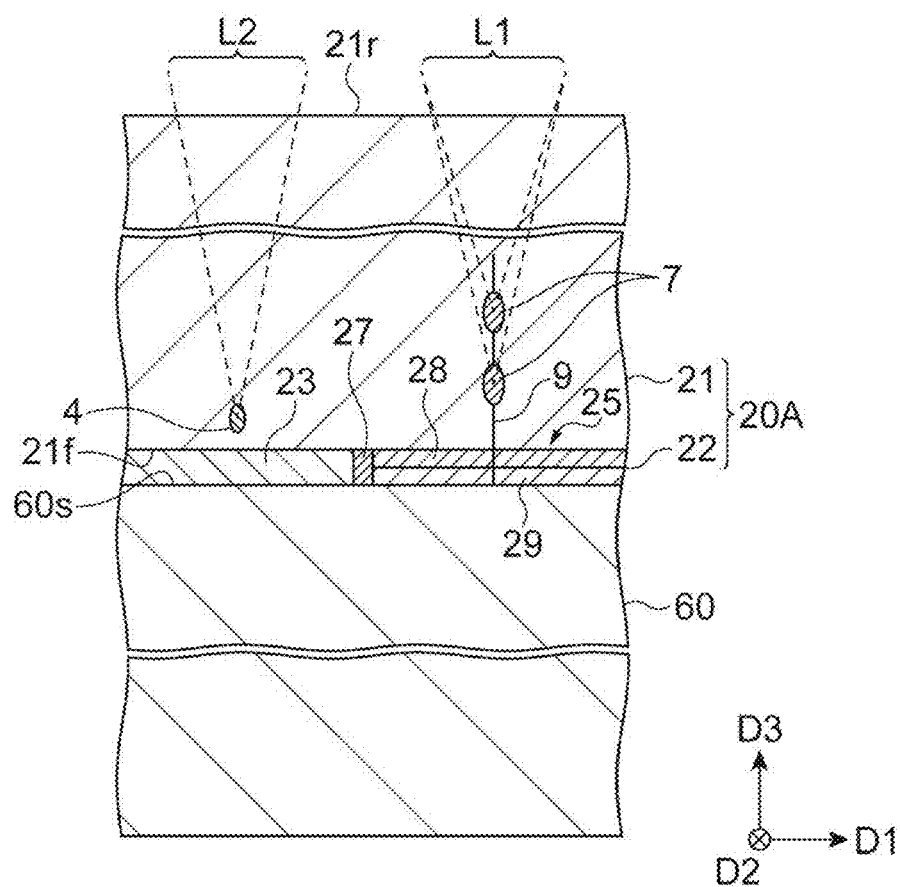
FIG. 18 is a diagram illustrating the main step of the laminated element manufacturing method according to the second embodiment.
Figure 18:
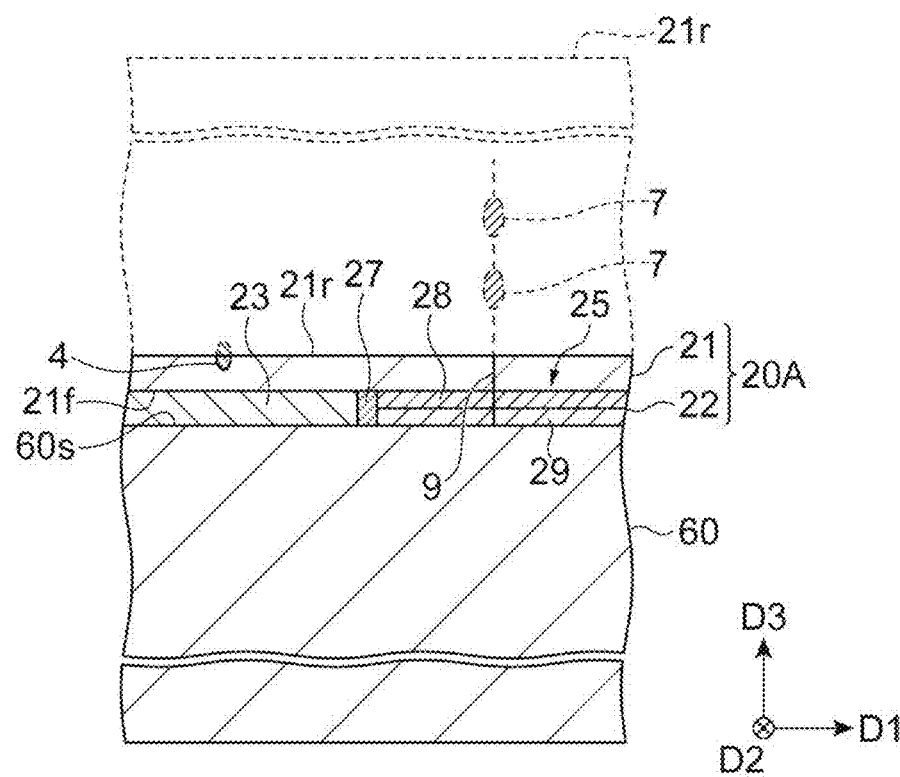

Then, as illustrated in (a) of FIG. 18, the semiconductor substrate 21 is irradiated with the laser light L1 along each of the lines to cut 5a and 5b by using the back surface 21r of the semiconductor substrate 21 of the semiconductor wafer 20A as an incident surface of the laser light L1, and thus a modified region (first modified region) 7 is formed along each of the lines to cut 5a and 5b in the semiconductor substrate 21. In addition, a fracture (first fracture) 9 extending from the modified region 7 toward the circuit layer 22 of the semiconductor wafer 20A is formed in the semiconductor substrate 21 (first forming step). Here, the fracture 9 is formed so as to reach at least the interface between the support substrate 60 and the circuit layer 22 of the semiconductor wafer 20A (that is, the bonded interface) and not to reach the support substrate 60. Further, the semiconductor substrate 21 is irradiated with a laser light L2 by using the back surface 21r of the semiconductor substrate 21 of the semiconductor wafer 20A as an incident surface of the laser light L1, so as to correspond to each functional element 23. Thereby, a gettering region (first gettering region) 4 is formed in the semiconductor substrate 21 for each functional element 23 (first forming step). The irradiation condition for each of the laser light L1 and the laser light L2 is as described in the first embodiment. Either of forming the modified region 7 and forming the gettering region 4 may be performed firstly. Forming the modified region 7 and forming the gettering region 4 may be performed simultaneously.

Then, as illustrated in (b) of FIG. 18, the semiconductor substrate 21 of the semiconductor wafer 20A on which the modified region 7 and the gettering region 4 are formed is ground (first grinding step). At this time, the modified region 7 is removed, and the fracture 9 is exposed to the back surface 21r of the semiconductor substrate 21 of the semiconductor wafer 20A. Further, a portion of the gettering region 4 is removed. Here, the semiconductor substrate 21 is ground from the back surface 21r side, and thus the semiconductor substrate 21 (that is, the semiconductor wafer 20A) is thinned. Here, for example, the semiconductor substrate 21 is ground such that the thickness of the semiconductor substrate 21 is about from 3 µm to 13 µm (as an example, the thickness is substantially equal to the thickness of the circuit layer 22). Thus, the total thickness of the semiconductor wafer 20A is set to, for example, about 6 µm to 26 µm. The new back surface 21r formed by the grinding is flat enough to allow direct bonding (as an example, the back surface is mirrored).

Figure 19:
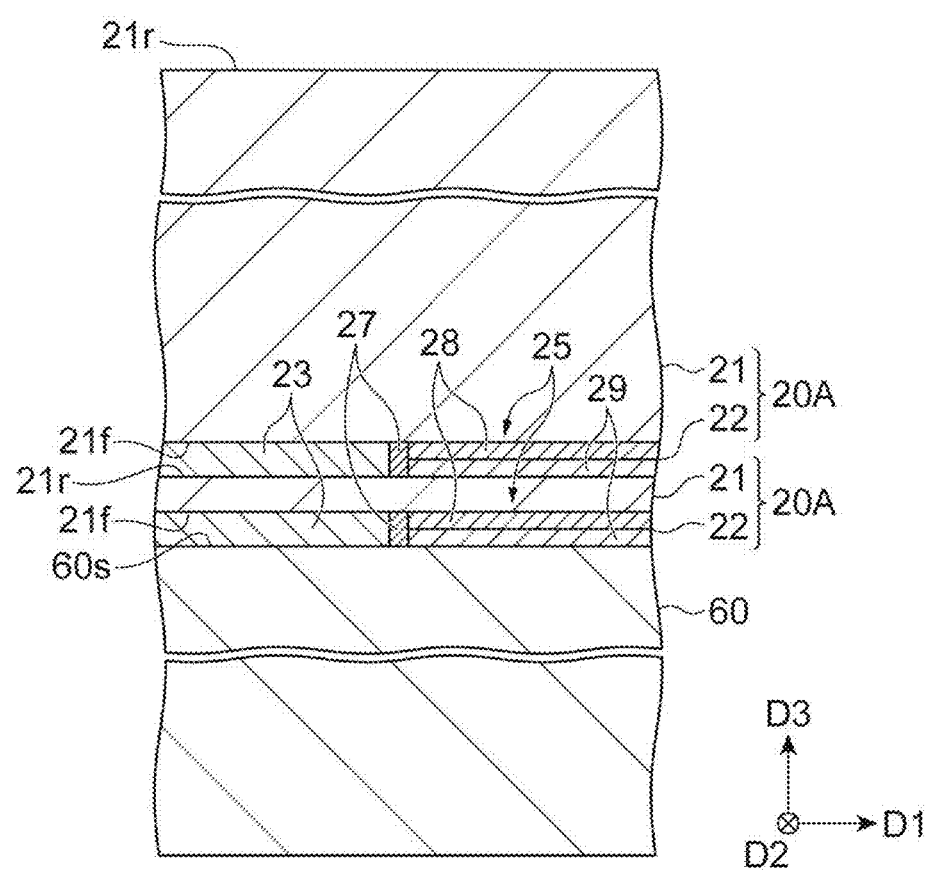
FIG. 19 is a diagram illustrating the main step of the laminated element manufacturing method according to the second embodiment.
Figure 19:
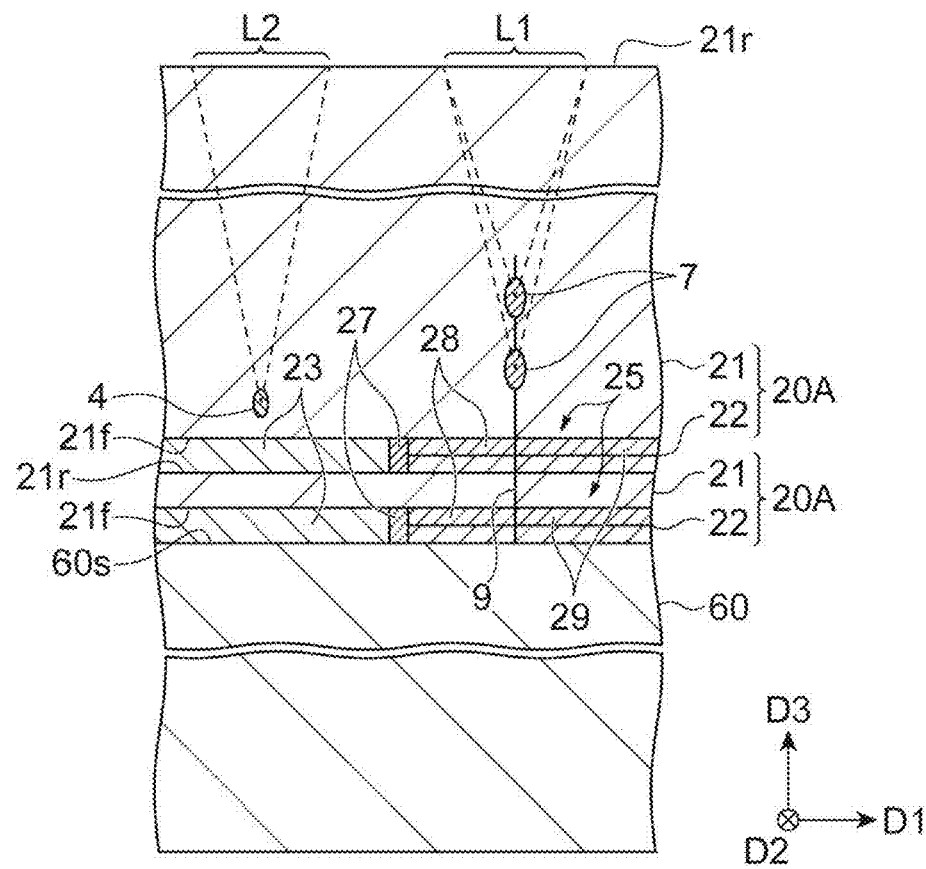

Then, as illustrated in (a) of FIG. 19, a new semiconductor wafer (second wafer) 20A is prepared, and the circuit layer 22 of the new semiconductor wafer 20A is directly bonded to the semiconductor substrate 21 of the ground semiconductor wafer 20A (bonding step). At this time, the functional elements 23 of the ground semiconductor wafer 20A correspond to the functional elements 23 of the new semiconductor wafer 20A in the third direction D3, respectively.

Then, as illustrated in (b) of FIG. 19, the semiconductor substrate 21 is irradiated with the laser light L1 along each of the lines to cut 5a and 5b by using the back surface 21r of the semiconductor substrate 21 of the new semiconductor wafer 20A as an incident surface of the laser light L1, and thus a modified region (second modified region) 7 is formed along each of the lines to cut 5a and 5b in the semiconductor substrate 21. In addition, a fracture (second fracture) 9 extending from the modified region 7 toward the circuit layer 22 of the new semiconductor wafer 20A is formed in the semiconductor substrate 21 (second forming step). Here, the fracture 9 is formed to reach at least the interface between the semiconductor substrate 21 of the ground semiconductor wafer 20A and the circuit layer 22 of the new semiconductor wafer 20A (that is, the directly bonded interface). Further, the semiconductor substrate 21 is irradiated with a laser light L2 by using the back surface 21r of the semiconductor substrate 21 of the new semiconductor wafer 20A as an incident surface of the laser light L1, so as to correspond to each functional element 23. Thereby, a gettering region (second gettering region) 4 is formed in the semiconductor substrate 21 for each functional element 23 (second forming step). The irradiation condition for each of the laser light L1 and the laser light L2 is as described in the first embodiment. Either of forming the modified region 7 and forming the gettering region 4 may be performed firstly. Forming the modified region 7 and forming the gettering region 4 may be performed simultaneously.

Figure 20:
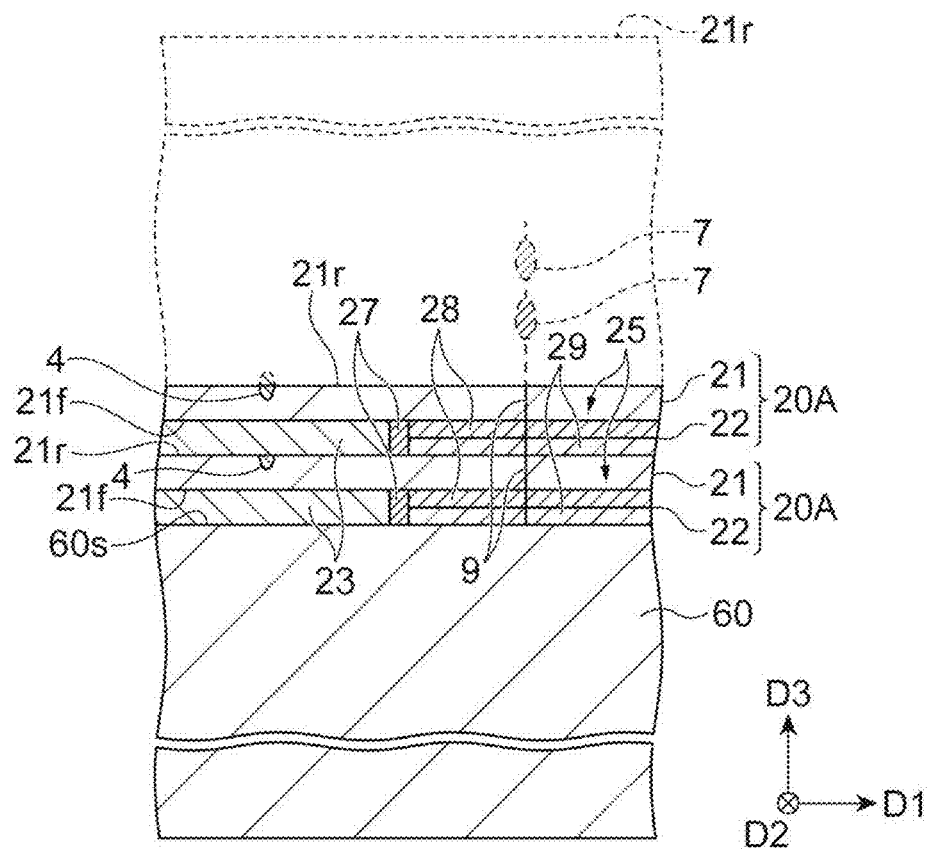
FIG. 20 is a diagram illustrating the main step of the laminated element manufacturing method according to the second embodiment.
Figure 20:
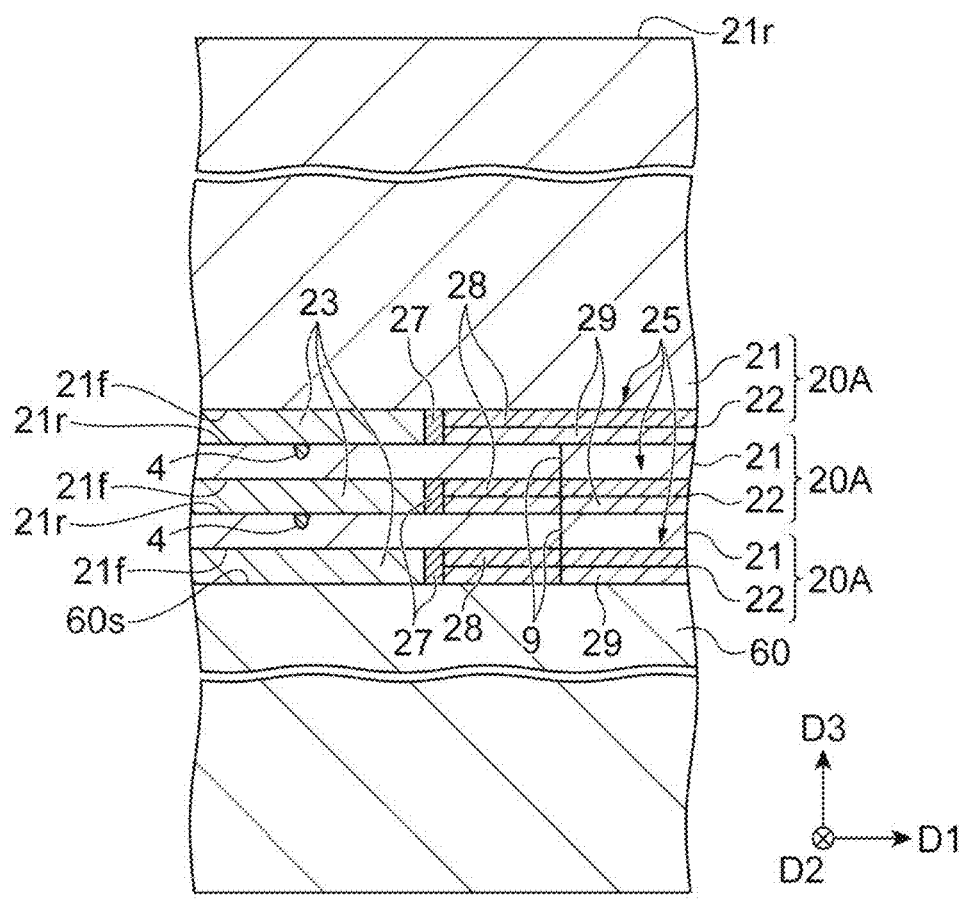

Then, as illustrated in (a) of FIG. 20, the semiconductor substrate 21 of the semiconductor wafer 20A on which the modified region 7 and the gettering region 4 are formed is ground (second grinding step). At this time, the modified region 7 is removed, and the fracture 9 is exposed to the back surface 21r of the semiconductor substrate 21 of the semiconductor wafer 20A. Further, a portion of the gettering region 4 is removed. Here, the semiconductor substrate 21 is ground from the back surface 21r side, and thus the semiconductor substrate 21 (that is, the semiconductor wafer 20A) is thinned. Here, for example, the semiconductor substrate 21 is ground such that the thickness of the semiconductor substrate 21 is about from 3 µm to 13 µm (as an example, the thickness is substantially equal to the thickness of the circuit layer 22). Thus, the total thickness of the semiconductor wafer 20A is set to, for example, about 6 µm to 26 µm. The new back surface 21r formed by the grinding is flat enough to allow direct bonding (as an example, the back surface is mirrored).

Figure 21:
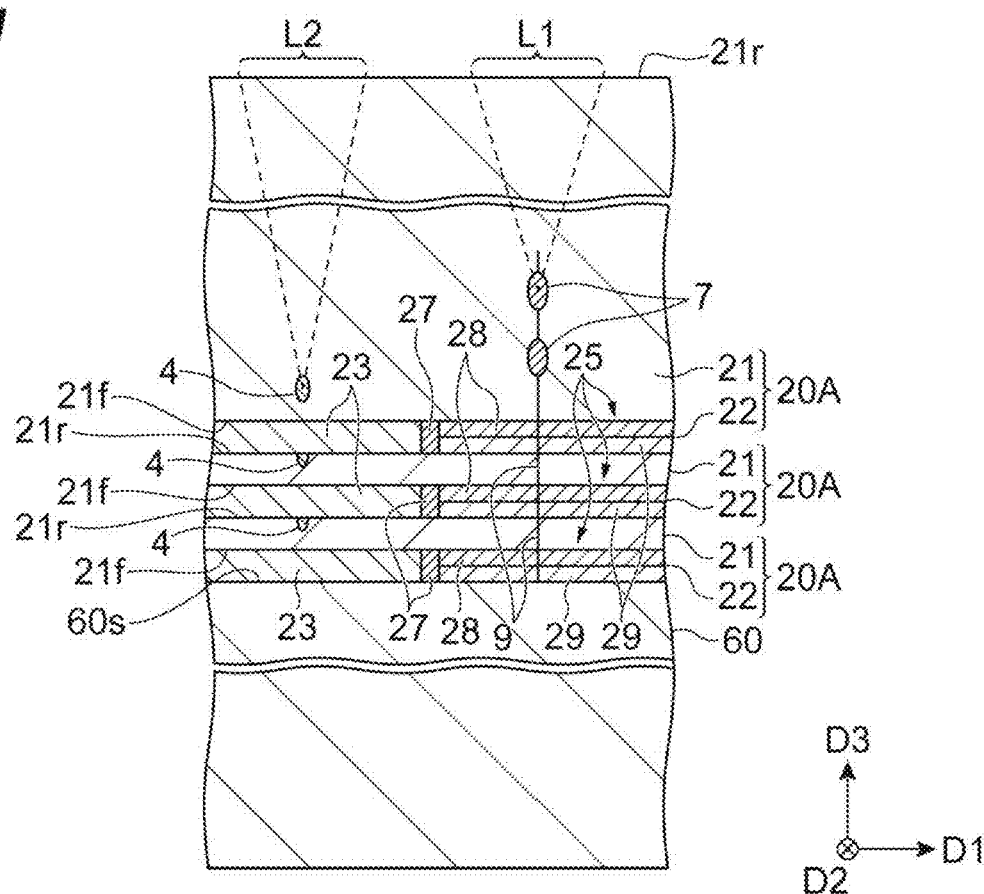
FIG. 21 is a diagram illustrating the main step of the laminated element manufacturing method according to the second embodiment.
Figure 21:
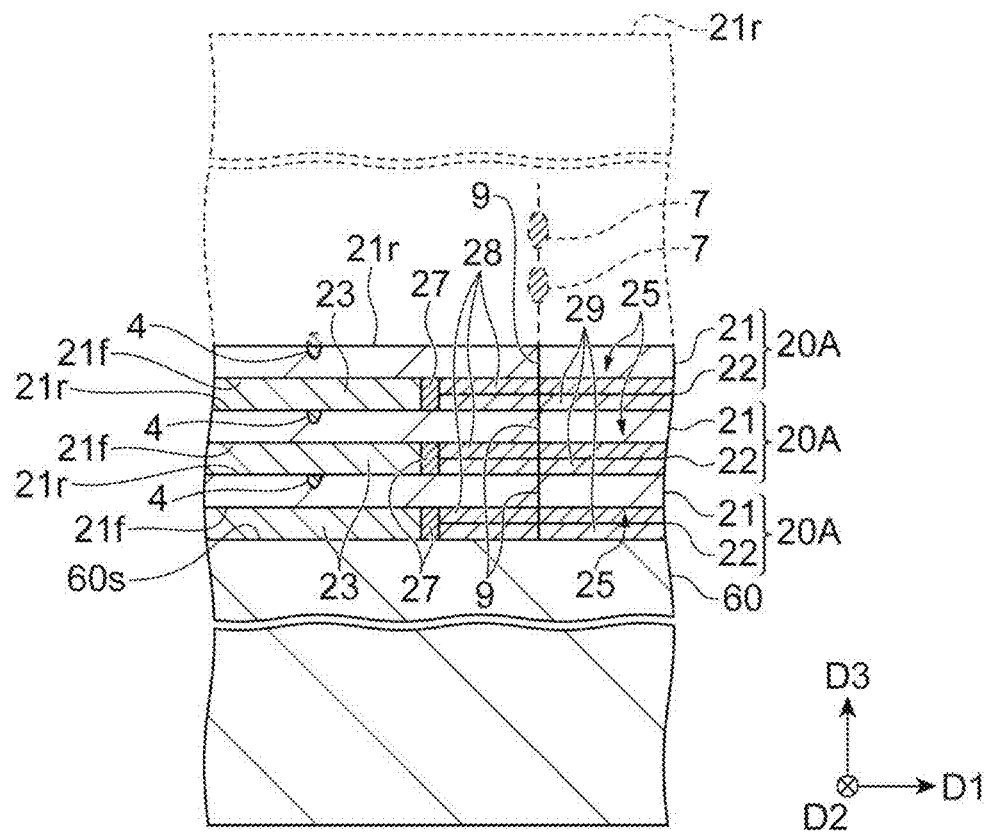

Then, as illustrated in (b) of FIG. 20, (a) of FIG. 21, and (b) of FIG. 21, a laminated body including a plurality (here, nine) of semiconductor wafers 20A laminated on the support substrate 60 is configured by repeating a flow of directly bonding the new semiconductor wafer 20A to the ground semiconductor wafer 20A, forming the modified region 7 and the gettering region 4 in the new semiconductor wafer 20A, and grinding the new semiconductor wafer 20A.

Figure 22:
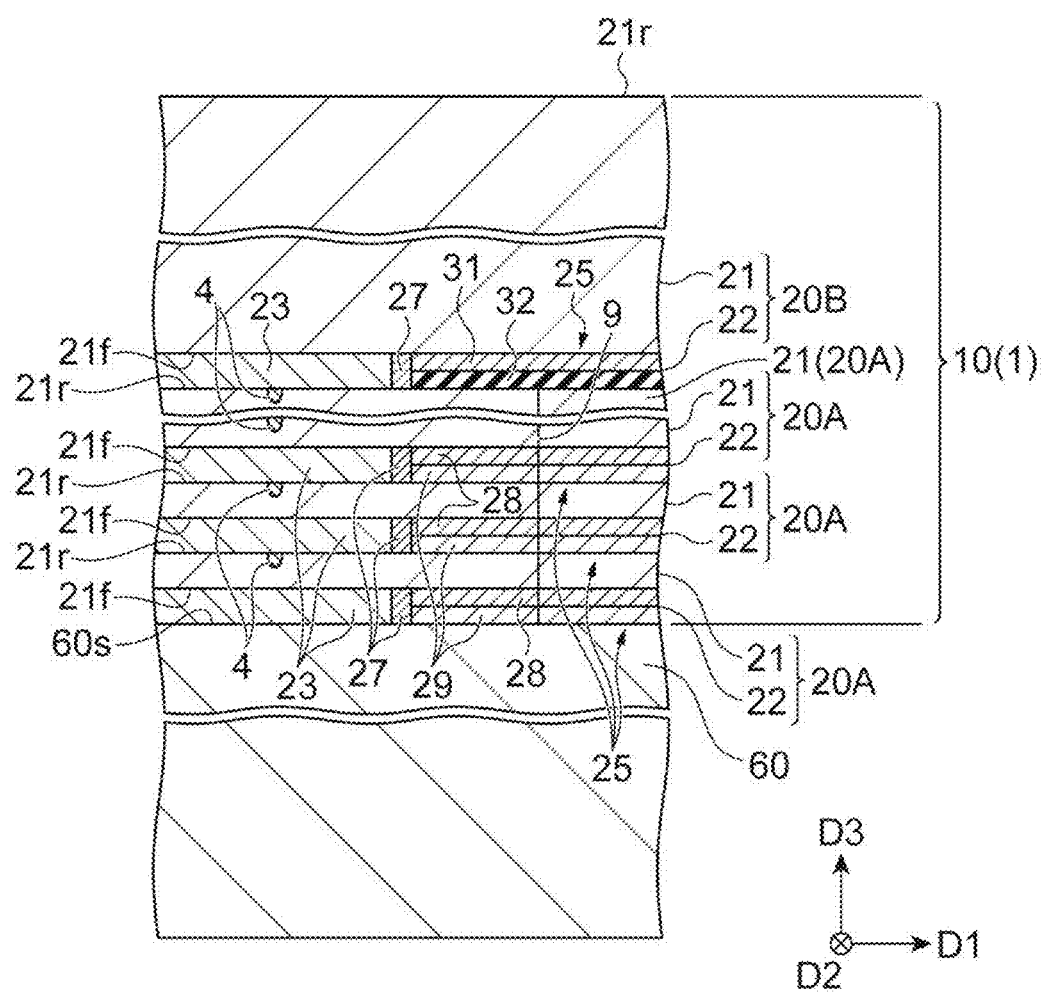
FIG. 22 is a diagram illustrating the main step of the laminated element manufacturing method according to the second embodiment.

Then, as illustrated in FIG. 22, a semiconductor wafer 20B is prepared, and a circuit layer 22 of the semiconductor wafer 20B is directly bonded to the semiconductor substrate 21 of the ground semiconductor wafer 20A. At this time, the functional elements 23 of the ground semiconductor wafer 20A correspond to the functional elements 23 of the semiconductor wafer 20B in the third direction D3, respectively. Thus, a laminated body 10 is obtained. Here, in the laminated body 10, the semiconductor substrates 21 and the circuit layers 22 are alternately laminated over the entirety of the laminated body 10.

Then, as illustrated in FIG. 15, the semiconductor substrate 21 is irradiated with the laser light L1 along each of the lines to cut 5a and 5b by using the back surface 21r of the semiconductor substrate 21 of the semiconductor wafer 20B as an incident surface of the laser light L1, and thus a modified region 7 is formed along each of the lines to cut 5a and 5b in the semiconductor substrate 21. In addition, a fracture 9 extending from the modified region 7 toward the circuit layer 22 of the semiconductor wafer 20B is formed in the semiconductor substrate 21. Here, the fracture 9 is formed to reach at least the interface between the semiconductor substrate 21 of the semiconductor wafer 20A and the circuit layer 22 of the semiconductor wafer 20B (that is, the directly bonded interface). Thus, the fracture 9 continues to the front surface of the circuit layer 22 of the semiconductor wafer 20A, which is located closest to the holder H (that is, a side to which the support substrate 60 is bonded) along each of the lines to cut 5a and 5b. Further, the semiconductor substrate 21 is irradiated with a laser light L2 by using the back surface 21r of the semiconductor substrate 21 of the semiconductor wafer 20B as an incident surface of the laser light L1, so as to correspond to each functional element 23 (that is, each functional element 23 as the driver IC). Thereby, the gettering region 4 is formed in the semiconductor substrate 21 for each functional element 23. The irradiation condition for each of the laser light L1 and the laser light L2 is as described in the first embodiment. Either of forming the modified region 7 and forming the gettering region 4 may be performed firstly. Forming the modified region 7 and forming the gettering region 4 may be performed simultaneously.

Then, as illustrated in (a) of FIG. 16, the semiconductor substrate 21 of the semiconductor wafer 20B on which the modified region 7 and the gettering region 4 are formed is ground. At this time, the modified region 7 is removed, and the fracture 9 is exposed to the back surface 21r of the semiconductor substrate 21 of the semiconductor wafer 20B. The gettering region 4 remains. Here, the semiconductor substrate 21 is ground from the back surface 21r side, and thus the semiconductor substrate 21 (that is, the semiconductor wafer 20B) is thinned. Here, for example, the semiconductor substrate 21 of the semiconductor wafer 20B is ground such that the thickness of the semiconductor substrate 21 is about 200 µm. The reason that the semiconductor substrate 21 of the semiconductor wafer 20B is left to be thicker than that in the other semiconductor substrates 21 is that the semiconductor substrate 21 of the semiconductor wafer 20B serves as the support substrate in the laminated element 15.

Then, as illustrated in (b) of FIG. 16, the laminated body 10 is in a state of being supported by an expandable support member S such as an expanded tape. At this time, the back surface 21r of the semiconductor substrate 21 of the semiconductor wafer 20B is disposed on the support member S side. In this state, if the support member S is expanded, the plurality of laminated elements 15 obtained by cutting the laminated body 10 along each of the lines to cut 5a and 5b are separated from each other, and each laminated element 15 is picked up (pick-up step).

With the above laminated element manufacturing method according to the second embodiment, effects similar to those in the first embodiment are exhibited.

Third Embodiment

Figure 23:
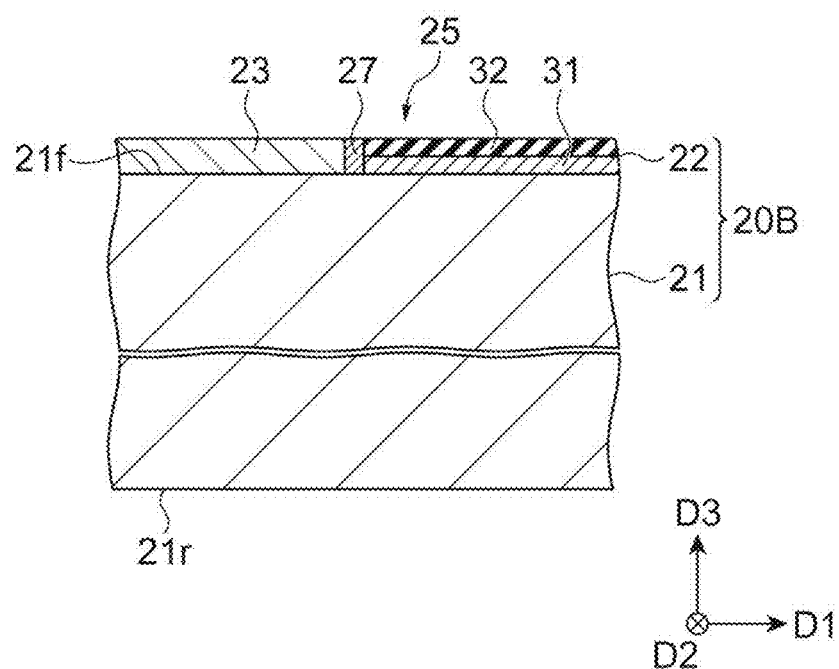
FIG. 23 is a diagram illustrating a main step of a laminated element manufacturing method according to a third embodiment.
Figure 23:
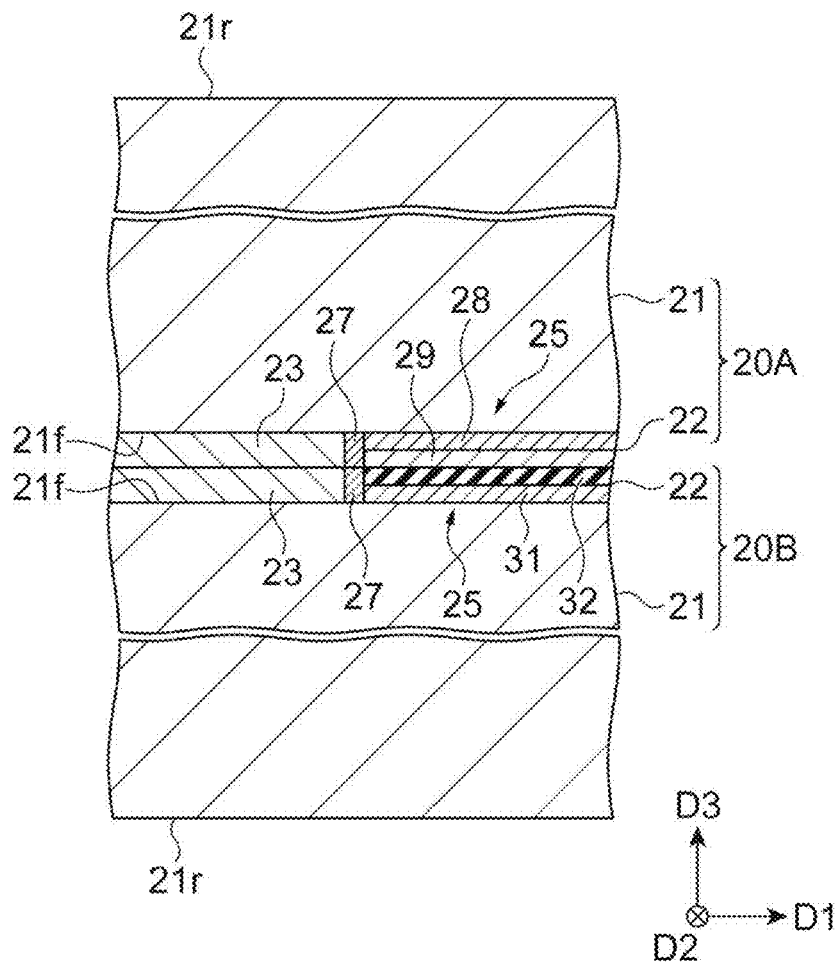

An example of a laminated element manufacturing method according to a third embodiment will be described. Firstly, as illustrated in (a) of FIG. 23, a semiconductor wafer 20B is prepared. Then, as illustrated in (b) of FIG. 23, a semiconductor wafer (first wafer) 20A is prepared. Then, the circuit layer 22 of the semiconductor wafer 20A is directly bonded to the circuit layer 22 of the semiconductor wafer 20B. At this time, the functional elements 23 of the semiconductor wafer 20B correspond to the functional elements 23 of the semiconductor wafer 20A in the third direction D3 intersecting with the front surface 21f and the back surface 21r, respectively.

Figure 24:
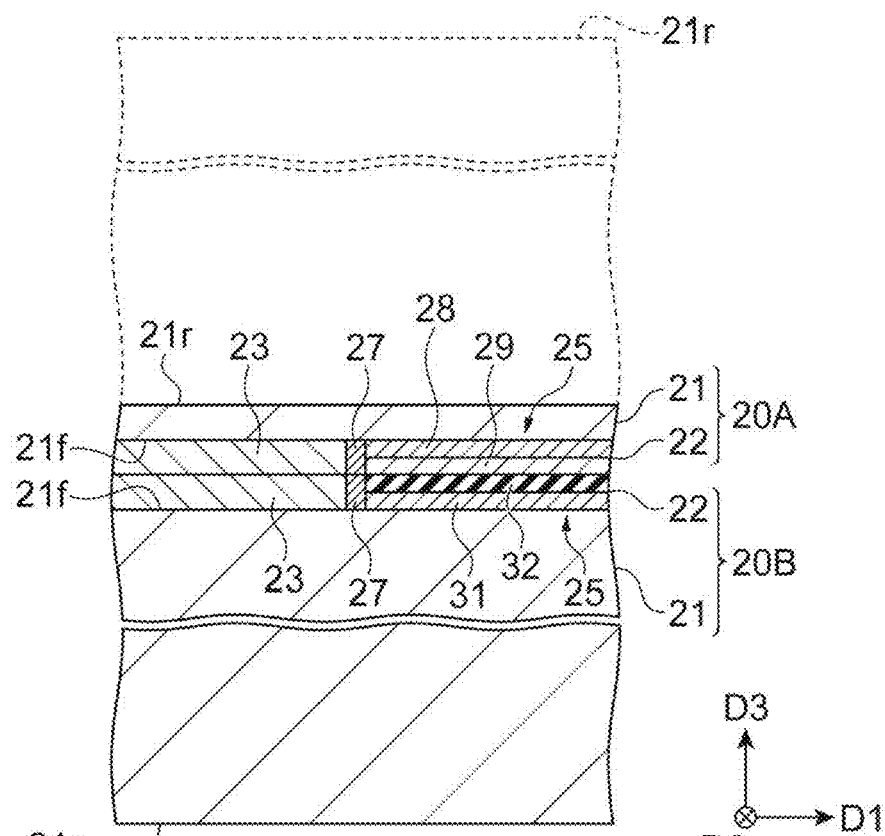
FIG. 24 is a diagram illustrating the main step of the laminated element manufacturing method according to the third embodiment.
Figure 24:
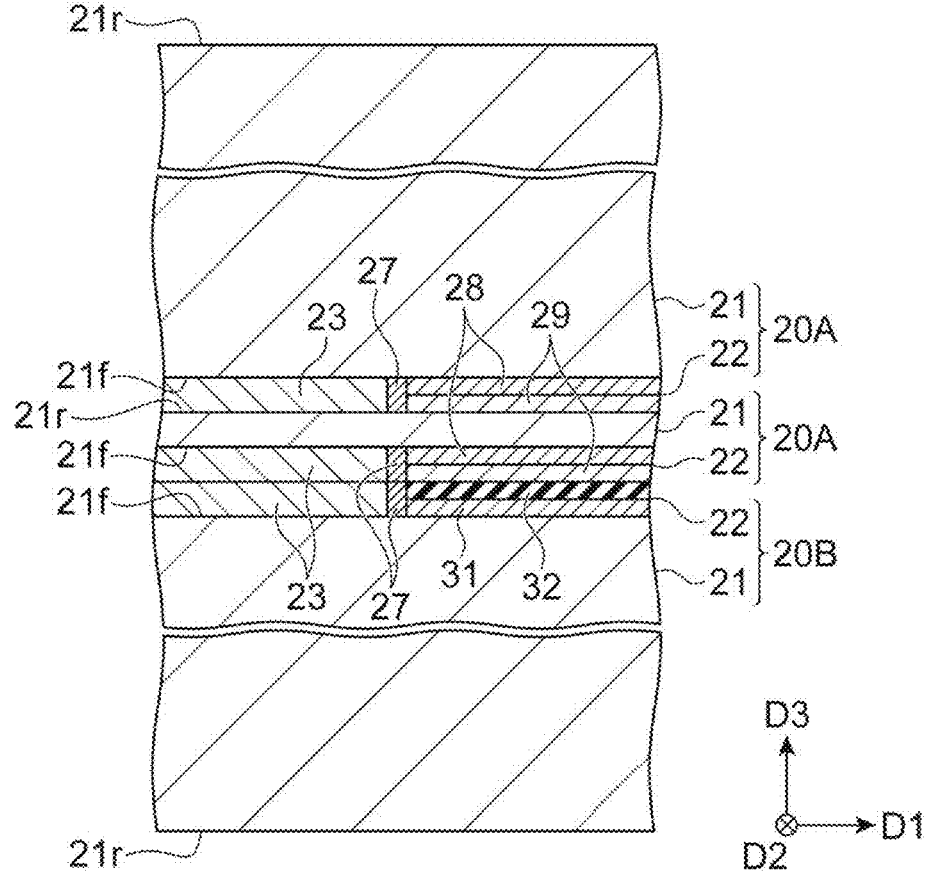

Then, as illustrated in (a) of FIG. 24, the semiconductor substrate 21 of the semiconductor wafer 20A is ground (first grinding step). Here, the semiconductor substrate 21 is ground from the back surface 21r side, and thus the semiconductor substrate 21 (that is, the semiconductor wafer 20A) is thinned. Here, for example, the semiconductor substrate 21 is ground such that the thickness of the semiconductor substrate 21 is about from 3 µm to 13 µm (as an example, the thickness is substantially equal to the thickness of the circuit layer 22). Thus, the total thickness of the semiconductor wafer 20A is set to, for example, about 6 µm to 26 µm. The new back surface 21r formed by the grinding is flat enough to allow direct bonding (as an example, the back surface is mirrored).

Then, as illustrated in (b) of FIG. 24, a new semiconductor wafer (second wafer) 20A is prepared, and the circuit layer 22 of the new semiconductor wafer 20A is directly bonded to the semiconductor substrate 21 of the ground semiconductor wafer 20A (bonding step). At this time, the functional elements 23 of the ground semiconductor wafer 20A correspond to the functional elements 23 of the new semiconductor wafer 20A in the third direction D3, respectively.

Figure 25:
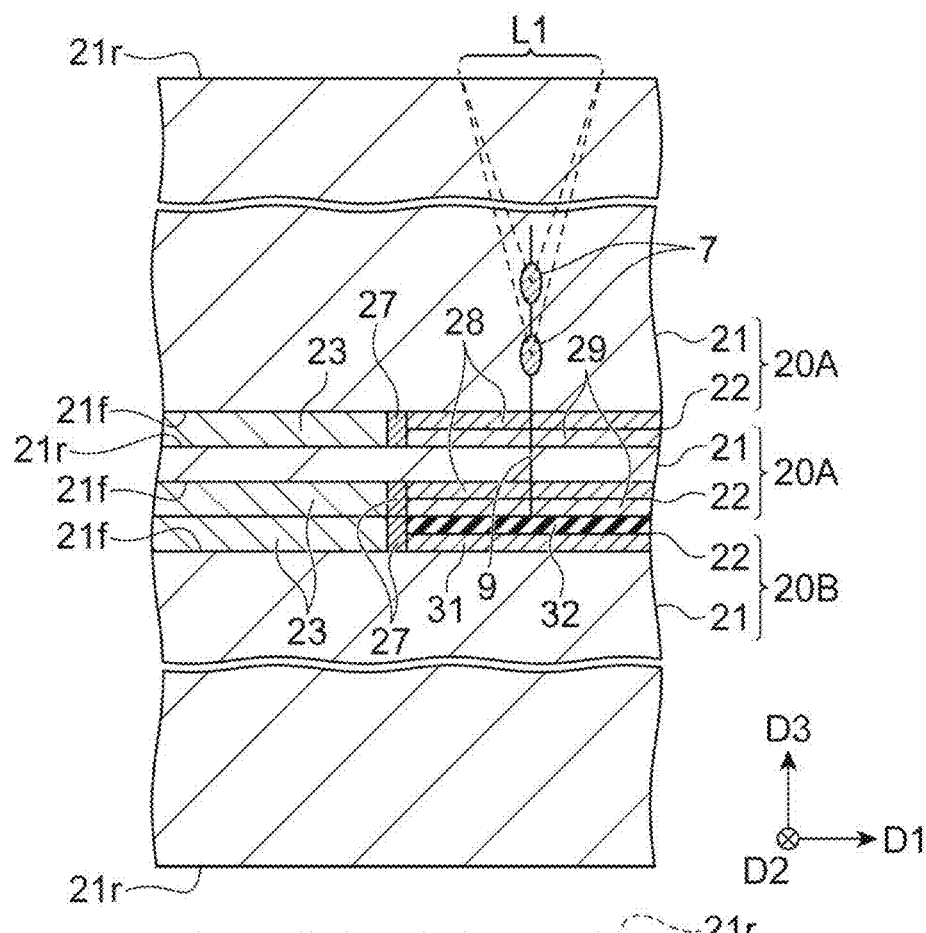
FIG. 25 is a diagram illustrating the main step of the laminated element manufacturing method according to the third embodiment.
Figure 25:
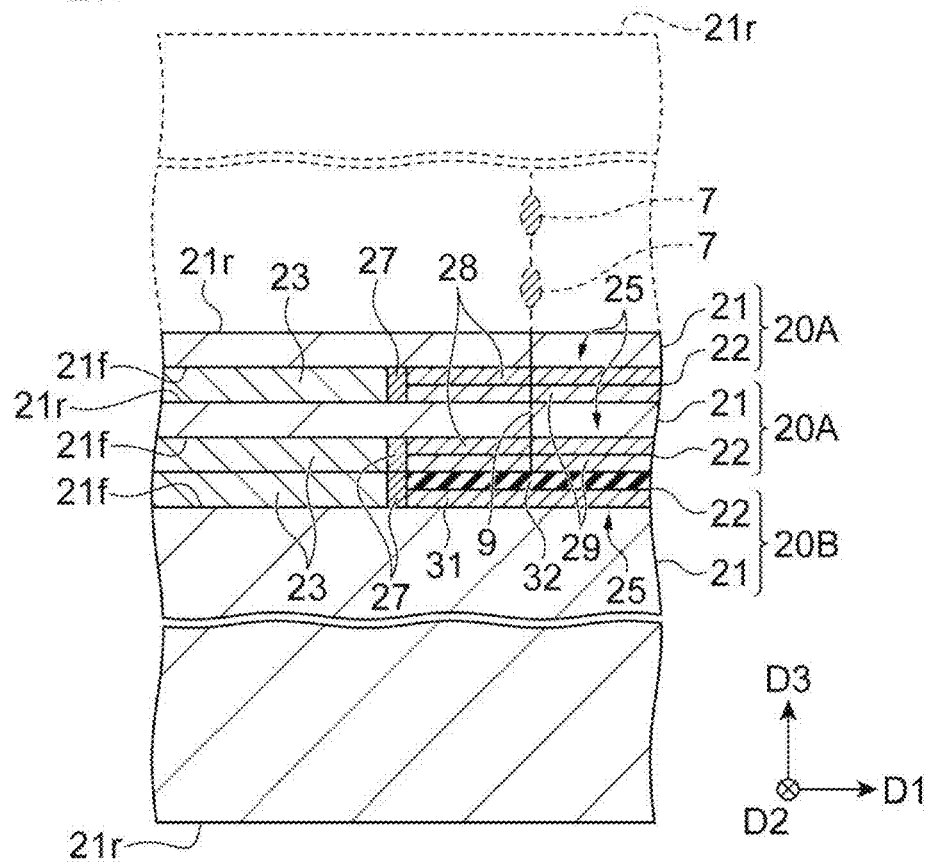

Then, as illustrated in (a) of FIG. 25, the semiconductor substrate 21 is irradiated with the laser light L1 along each of the lines to cut 5a and 5b by using the back surface 21r of the semiconductor substrate 21 of the semiconductor wafer 20A as an incident surface of the laser light L1, and thus a modified region 7 is formed along each of the lines to cut 5a and 5b in the semiconductor substrate 21. In addition, a fracture 9 extending from the modified region 7 toward the circuit layer 22 of the semiconductor wafer 20A is formed in the semiconductor substrate 21 (forming step). Here, the fracture 9 is formed to reach at least the interface between the circuit layer 22 of the ground semiconductor wafer 20A and the semiconductor substrate 21 of the ground semiconductor wafer 20A. Since the semiconductor substrate 21 of the semiconductor wafer 20B functions as a support substrate, the fracture 9 is formed so as not to reach the semiconductor substrate 21 of the semiconductor wafer 20B. The irradiation condition for the laser light L1 is as described in the first embodiment.

Then, as illustrated in (b) of FIG. 25, the semiconductor substrate 21 of the semiconductor wafer 20A on which the modified region 7 is formed is ground (second grinding step). At this time, the modified region 7 is removed, and the fracture 9 is exposed to the back surface 21r of the semiconductor substrate 21 of the semiconductor wafer 20A. Here, the semiconductor substrate 21 is ground from the back surface 21r side, and thus the semiconductor substrate 21 (that is, the semiconductor wafer 20A) is thinned. Here, for example, the semiconductor substrate 21 is ground such that the thickness of the semiconductor substrate 21 is about from 3 µm to 13 µm (as an example, the thickness is substantially equal to the thickness of the circuit layer 22). Thus, the total thickness of the semiconductor wafer 20A is set to, for example, about 6 µm to 26 µm. The new back surface 21r formed by the grinding is flat enough to allow direct bonding (as an example, the back surface is mirrored).

Figure 26:
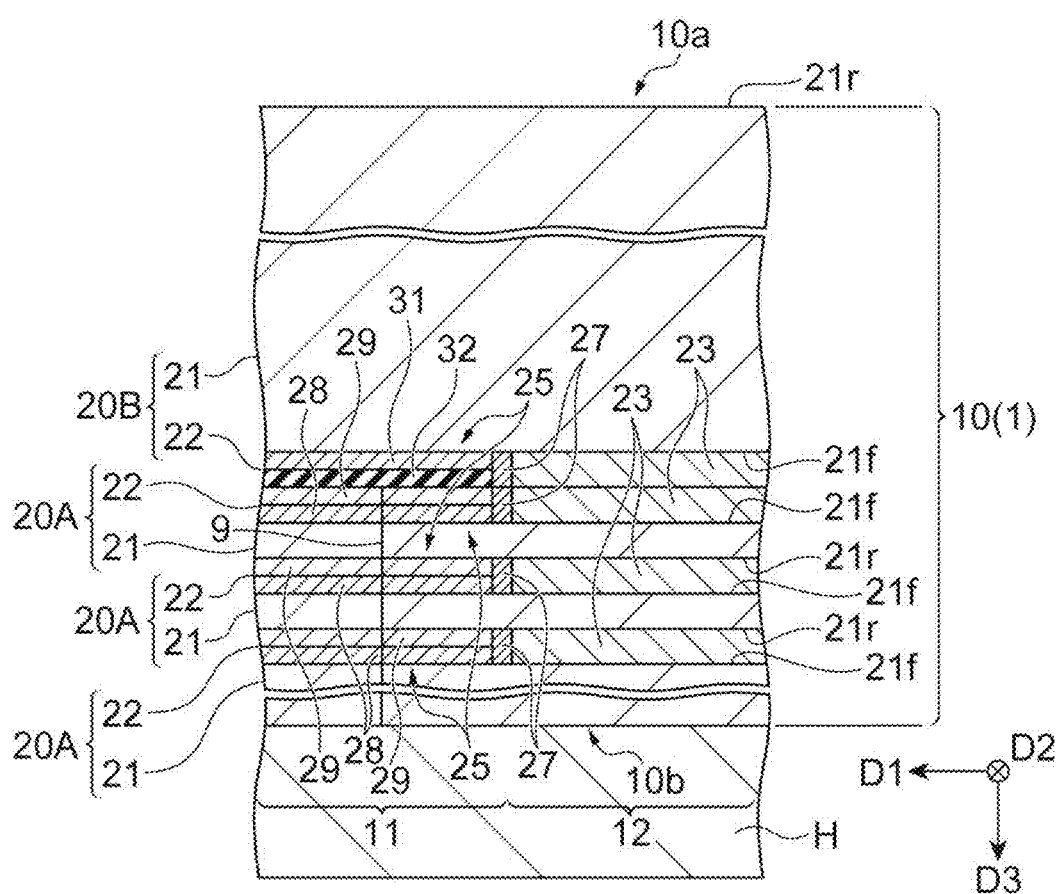
FIG. 26 is a diagram illustrating the main step of the laminated element manufacturing method according to the third embodiment.

Then, as illustrated in FIG. 26, the laminated body 10 is configured by repeating a flow of directly bonding the new semiconductor wafer 20A to the ground semiconductor wafer 20A, forming the modified region 7 in the new semiconductor wafer 20A, and grinding the new semiconductor wafer 20A. Forming the modified region 7 in the new semiconductor wafer 20A is performed every time the steps from the direct bonding of the new semiconductor wafer 20A to the ground semiconductor wafer 20A to grinding of the new semiconductor wafer 20A are performed not once but plural times. Thus, for example, one semiconductor wafer 20B including the functional element 23 as the driver IC and a plurality (here, nine) of semiconductor wafers 20A including the functional element 23 as the semiconductor memory are laminated, and thereby a laminated body 10 configured with a plurality (here, ten) of semiconductor wafers 20 is obtained.

Then, as illustrated in FIG. 15, the semiconductor substrate 21 is irradiated with the laser light L1 along each of the lines to cut 5a and 5b by using the back surface 21r of the semiconductor substrate 21 of the semiconductor wafer 20B as an incident surface of the laser light L1, and thus a modified region 7 is formed along each of the lines to cut 5a and 5b in the semiconductor substrate 21. In addition, a fracture 9 extending from the modified region 7 toward the circuit layer 22 of the semiconductor wafer 20B is formed in the semiconductor substrate 21. Here, the fracture 9 is formed to reach at least the interface between the circuit layer 22 of the semiconductor wafer 20A and the circuit layer 22 of the semiconductor wafer 20B (that is, the directly bonded interface).

Although the irradiation condition for the laser light L1 is as described in the first embodiment, a specific example of the irradiation condition for the laser light L1 may be as follows in a case where the gettering region 4 is not formed in the same step in which the modified region 7 is formed. So long as a desired fracture 9 can be generated from the modified region 7, the number of lines of the modified regions 7 formed along each of the lines to cut 5a and 5b (number of lines of the modified regions 7 arranged in the third direction D3) may be plural or one.

Wavelength: 1170 to 1800 nm
Pulse width: 350 ns or more
Pulse energy: 25 µJ or more
Pulse pitch: 6.5 to 45 µm
Distance between the modified region 7 on the circuit layer 22 side and the front surface 21f: 200 m or more
Number of times of scanning of each of the lines to cut 5a and 5b with the laser light L1: two times Then, as illustrated in (a) of FIG. 16, the semiconductor substrate 21 of the semiconductor wafer 20B on which the modified region 7 is formed is ground. At this time, the modified region 7 is removed, and the fracture 9 is exposed to the back surface 21r of the semiconductor substrate 21 of the semiconductor wafer 20B. Here, the semiconductor substrate 21 is ground from the back surface 21r side, and thus the semiconductor substrate 21 (that is, the semiconductor wafer 20B) is thinned. Here, for example, the semiconductor substrate 21 of the semiconductor wafer 20B is ground such that the thickness of the semiconductor substrate 21 is about 200 µm. The reason that the semiconductor substrate 21 of the semiconductor wafer 20B is left to be thicker than that in the other semiconductor substrates 21 is that the semiconductor substrate 21 of the semiconductor wafer 20B serves as the support substrate in the laminated element 15.

Then, as illustrated in (b) of FIG. 16, the laminated body 10 is in a state of being supported by an expandable support member S such as an expanded tape. At this time, the back surface 21r of the semiconductor substrate 21 of the semiconductor wafer 20B is disposed on the support member S side. In this state, if the support member S is expanded, the plurality of laminated elements 15 obtained by cutting the laminated body 10 along each of the lines to cut 5a and 5b are separated from each other, and each laminated element 15 is picked up (pick-up step).

As described above, in the laminated element manufacturing method according to the third embodiment, it is possible to obtain the laminated body 10 in which the plurality of semiconductor wafers 20A are laminated in a state where each semiconductor substrate 21 is thinned, by repeating a flow of grinding the semiconductor substrate 21 of the semiconductor wafer 20A, directly bonding the circuit layer 22 of the new semiconductor wafer 20A to the semiconductor substrate 21 of the semiconductor wafer 20A, and grinding the semiconductor substrate 21 of the new semiconductor wafer 20A. In addition, since the modified region 7 is formed in one semiconductor substrate 21 among a plurality of semiconductor substrates 21 before the semiconductor substrates 21 are ground, it is possible to obtain a laminated body 10 in which the modified region 7 is formed in at least one semiconductor substrate 21. Here, if blade dicing is used for cutting the laminated body 10 as described above, the yield is significantly reduced by chipping at a bonding interface of the semiconductor wafer 20A. On the contrary, in the laminated element manufacturing method according to the third embodiment, since the fracture 9 extends from the modified region 7 formed in at least one semiconductor substrate 21, it is possible to cut the laminated body 10 while suppressing an occurrence of chipping at the bonding interface of the semiconductor wafer 20A. Thus, according to the laminated element manufacturing method according to the third embodiment, it is possible to achieve both thinning of the laminated element 15 and improvement of the yield.

Further, in the laminated element manufacturing method according to the third embodiment, when the modified region 7 is formed in each semiconductor substrate 21, the fracture 9 extending from the modified region 7 toward the circuit layer 22 is formed. In particular, in the manufacturing method of the laminated element 15 according to the first embodiment, when the modified region 7 is formed in each semiconductor substrate 21, the fracture 9 is formed to reach the interface between the semiconductor substrate 21 and the circuit layer 22 which are directly bonded to each other. Thus, it is possible to more easily cut the laminated body 10 along each of the lines to cut 5a and 5b with higher accuracy.

Further, in the laminated element manufacturing method according to the third embodiment, when each semiconductor substrate 21 is ground, the modified region 7 is removed, and the fracture 9 is exposed to the back surface 21r of the semiconductor substrate 21. Accordingly, since the modified region 7 does not remain on the cut surface of the manufactured laminated element 15, it is possible to suppress degradation of flexural strength of the laminated element 15.

Further, in the laminated element manufacturing method according to the third embodiment, the plurality of laminated elements 15 obtained by cutting the laminated body 10 along each of the lines to cut 5a and 5b are picked up. Thus, it is possible to obtain the laminated element 15 with high efficiency.

Fourth Embodiment

Figure 27:
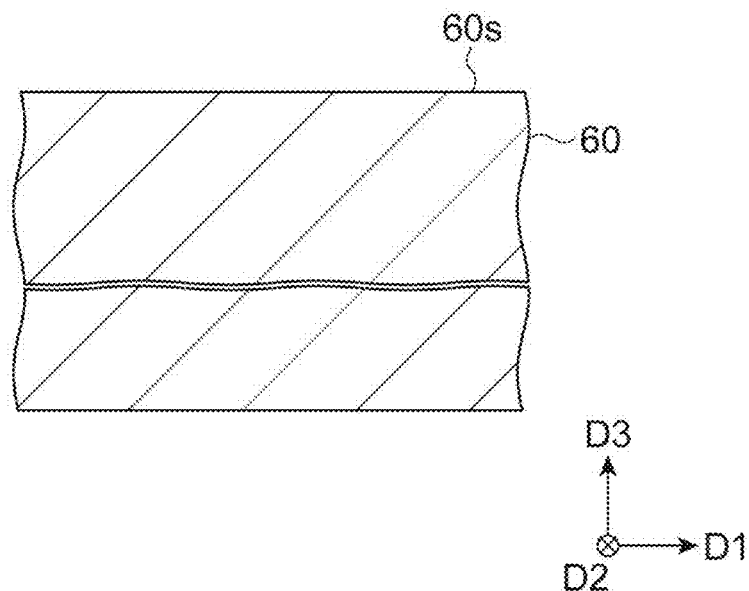
FIG. 27 is a diagram illustrating a main step of a laminated element manufacturing method according to a fourth embodiment.
Figure 27:
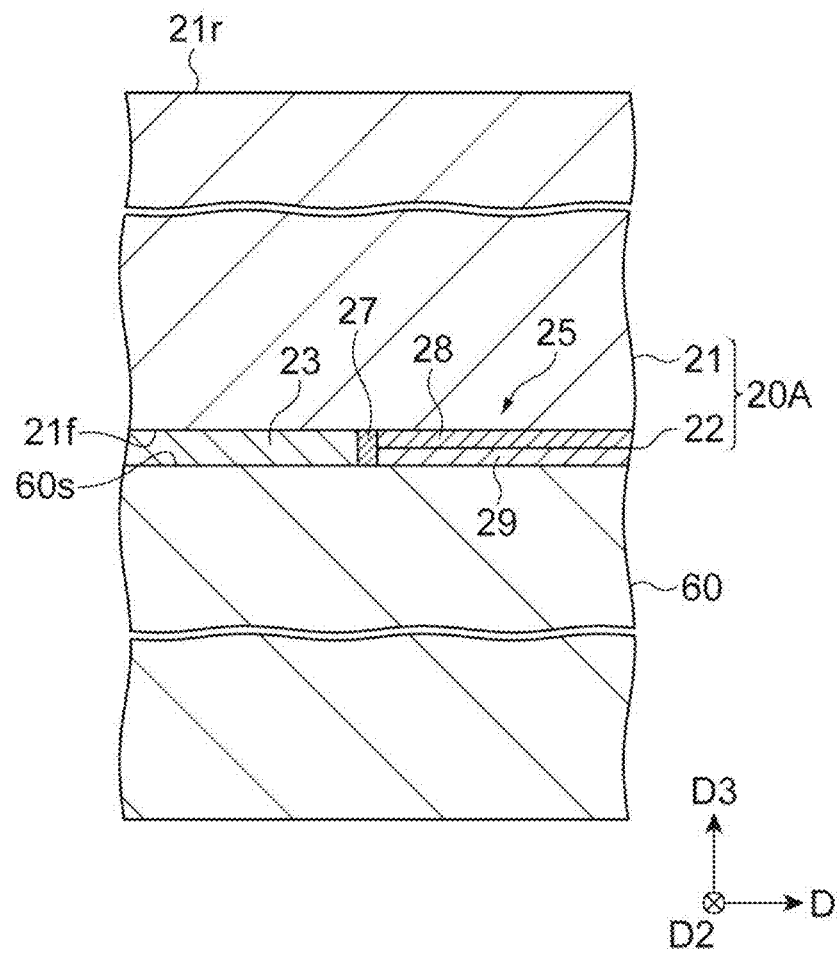

An example of a laminated element manufacturing method according to a fourth embodiment will be described. Here, firstly, as illustrated in (a) of FIG. 27, a support substrate 60 is prepared. Then, as illustrated in (b) of FIG.

27, a semiconductor wafer (first wafer) 20A is prepared. Then, a circuit layer 22 of the semiconductor wafer 20A is bonded to a front surface 60s of the support substrate 60.

Figure 28:
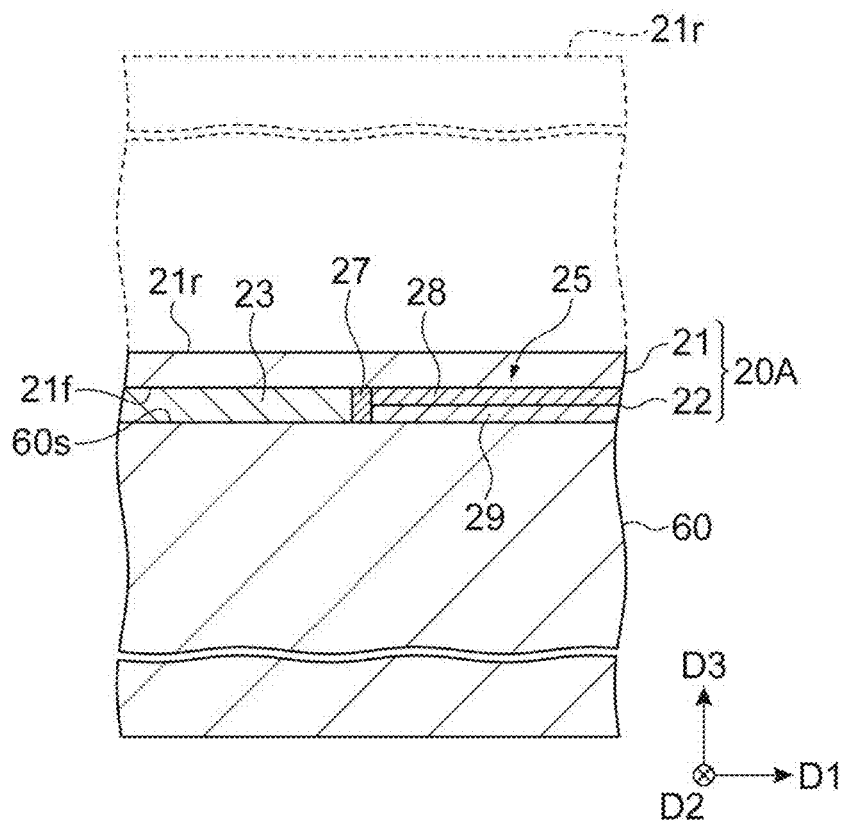
FIG. 28 is a diagram illustrating the main step of the laminated element manufacturing method according to the fourth embodiment.
Figure 28:
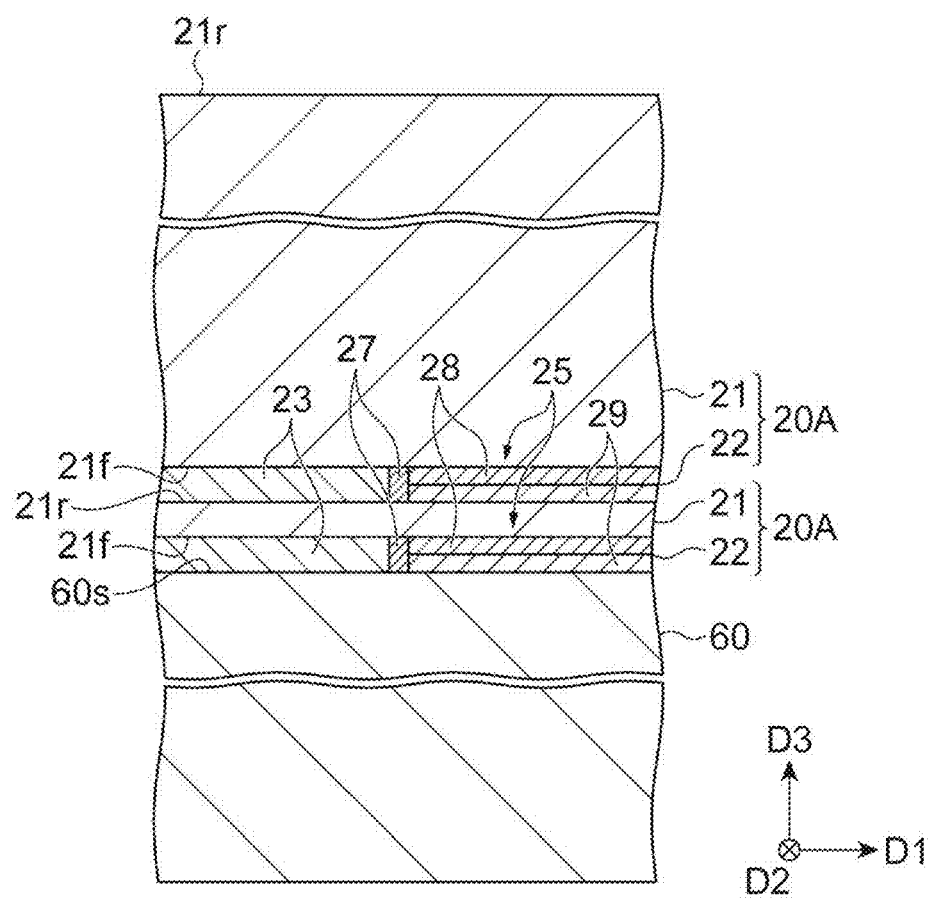

Then, as illustrated in (a) of FIG. 28, the semiconductor substrate 21 of the semiconductor wafer 20A is ground (first grinding step). Here, the semiconductor substrate 21 is ground from the back surface 21r side, and thus the semiconductor substrate 21 (that is, the semiconductor wafer 20A) is thinned. Here, for example, the semiconductor substrate 21 is ground such that the thickness of the semiconductor substrate 21 is about from 3 μm to 13 μm (as an example, the thickness is substantially equal to the thickness of the circuit layer 22). Thus, the total thickness of the semiconductor wafer 20A is set to, for example, about 6 μm to 26 μm. The new back surface 21r formed by the grinding is flat enough to allow direct bonding (as an example, the back surface is mirrored).

Then, as illustrated in (b) of FIG. 28, a new semiconductor wafer (second wafer) 20A is prepared, and the circuit layer 22 of the new semiconductor wafer 20A is directly bonded to the semiconductor substrate 21 of the ground semiconductor wafer 20A (bonding step). At this time, the functional elements 23 of the ground semiconductor wafer 20A correspond to the functional elements 23 of the new semiconductor wafer 20A in the third direction D3, respectively.

Figure 29:
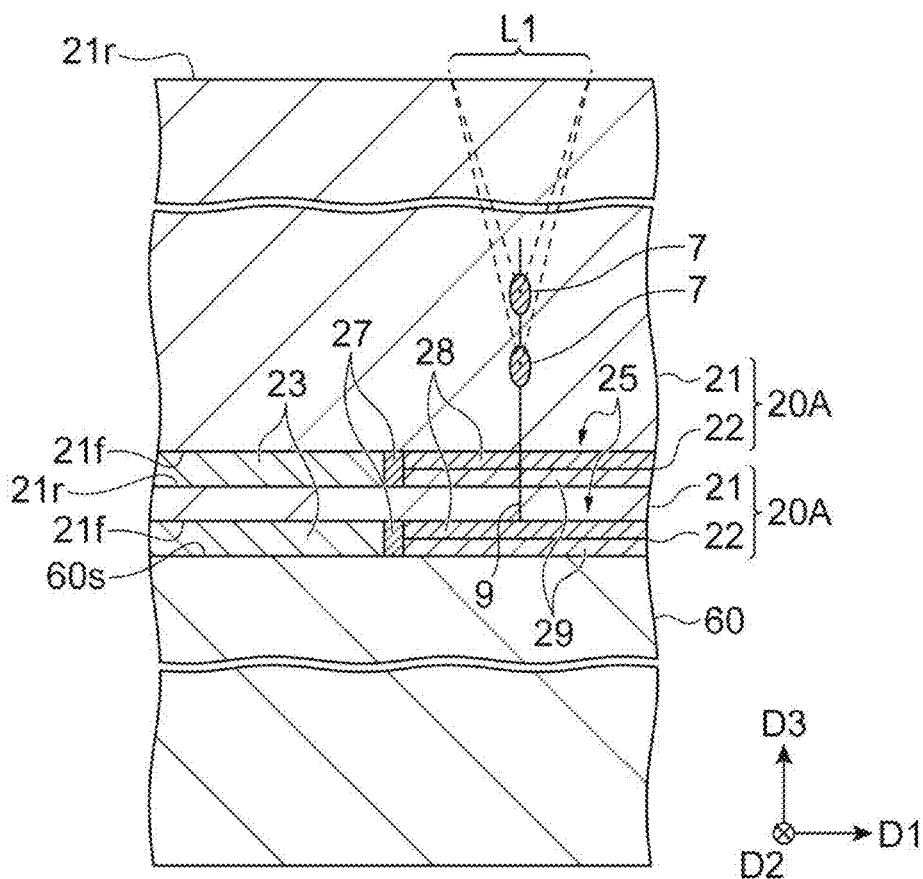
FIG. 29 is a diagram illustrating the main step of the laminated element manufacturing method according to the fourth embodiment.
Figure 29:
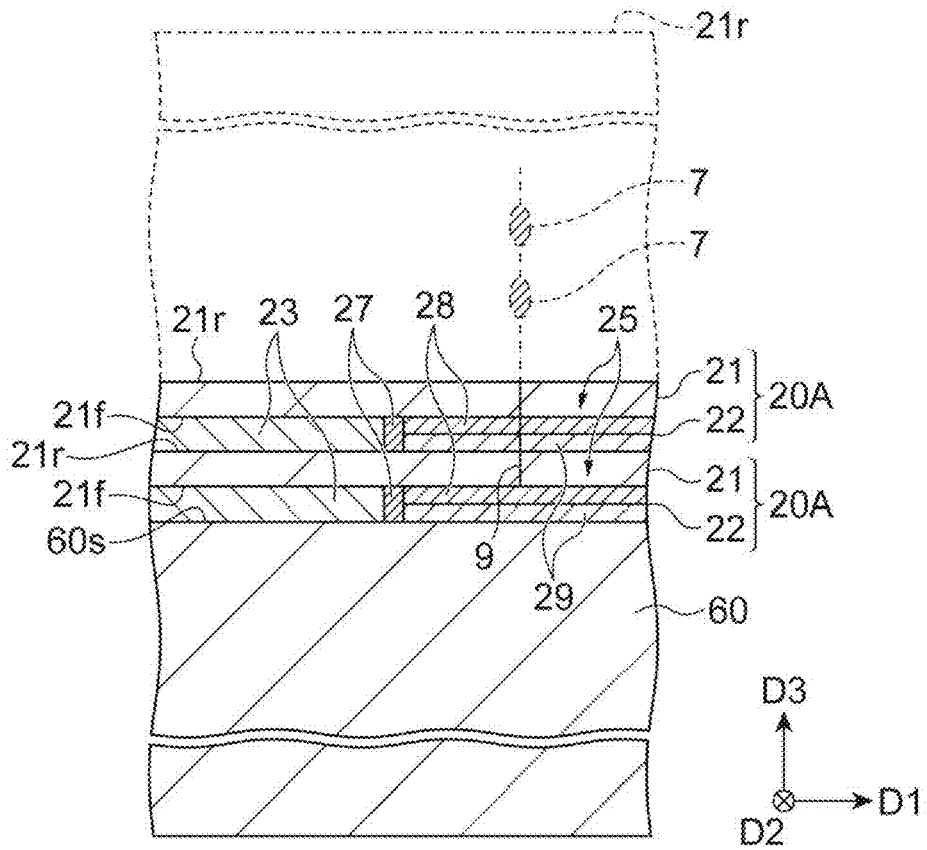

Then, as illustrated in (a) of FIG. 29, the semiconductor substrate 21 is irradiated with the laser light L1 along each of the lines to cut 5a and 5b by using the back surface 21r of the semiconductor substrate 21 of the semiconductor wafer 20A as an incident surface of the laser light L1, and thus a modified region 7 is formed along each of the lines to cut 5a and 5b in the semiconductor substrate 21. In addition, a fracture 9 extending from the modified region 7 toward the circuit layer 22 of the semiconductor wafer 20A is formed in the semiconductor substrate 21 (forming step). Here, the fracture 9 is formed so as to reach at least the interface between the circuit layer 22 of the ground semiconductor wafer 20A and the semiconductor substrate 21 of the ground semiconductor wafer 20A and so as not to reach the support substrate 60. The irradiation condition for the laser light L1 is as described in the first embodiment.

Then, as illustrated in (b) of FIG. 29, the semiconductor substrate 21 of the semiconductor wafer 20A on which the modified region 7 is formed is ground (second grinding step). At this time, the modified region 7 is removed, and the fracture 9 is exposed to the back surface 21r of the semiconductor substrate 21 of the semiconductor wafer 20A. Here, the semiconductor substrate 21 is ground from the back surface 21r side, and thus the semiconductor substrate 21 (that is, the semiconductor wafer 20A) is thinned. Here, for example, the semiconductor substrate 21 is ground such that the thickness of the semiconductor substrate 21 is about from 3 μm to 13 μm (as an example, the thickness is substantially equal to the thickness of the circuit layer 22). Thus, the total thickness of the semiconductor wafer 20A is set to, for example, about 6 μm to 26 μm. The new back surface 21r formed by the grinding is flat enough to allow direct bonding (as an example, the back surface is mirrored).

Figure 30:
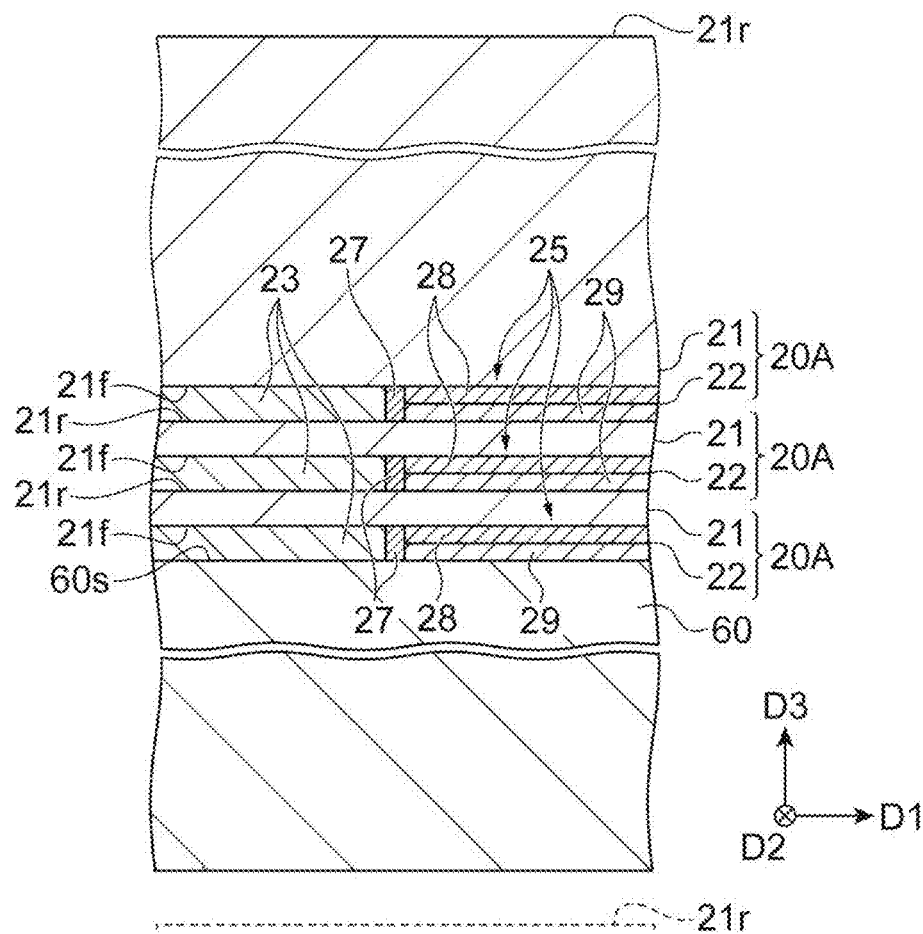
FIG. 30 is a diagram illustrating the main step of the laminated element manufacturing method according to the fourth embodiment.
Figure 30:
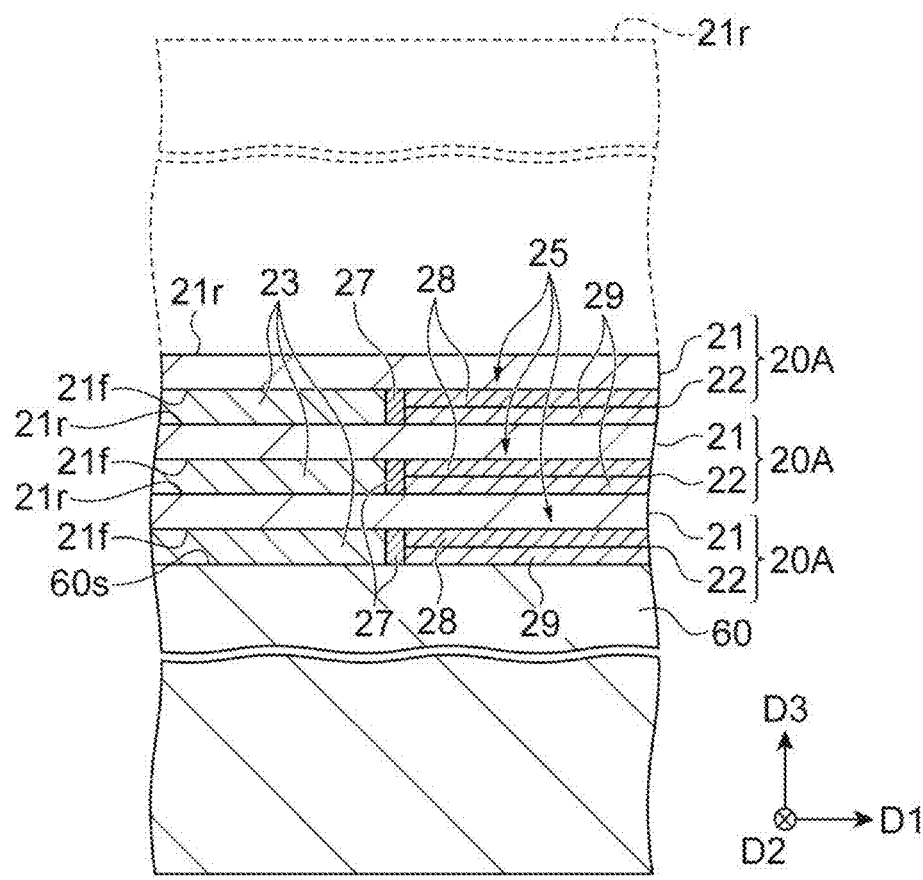

Then, as illustrated in (a) of FIG. 30 and (b) of FIG. 30, a laminated body including a plurality (here, nine) of semiconductor wafers 20A laminated on the support substrate 60 is configured by repeating a flow of directly bonding the new semiconductor wafer 20A to the ground semiconductor wafer 20A, forming the modified region 7 in the new semiconductor wafer 20A, and grinding the new semiconductor wafer 20A. Forming the modified region 7 in the new semiconductor wafer 20A is performed every time the steps from the direct bonding of the new semiconductor wafer 20A to the ground semiconductor wafer 20A to grinding of the new semiconductor wafer 20A are performed not once but plural times.

Figure 31:
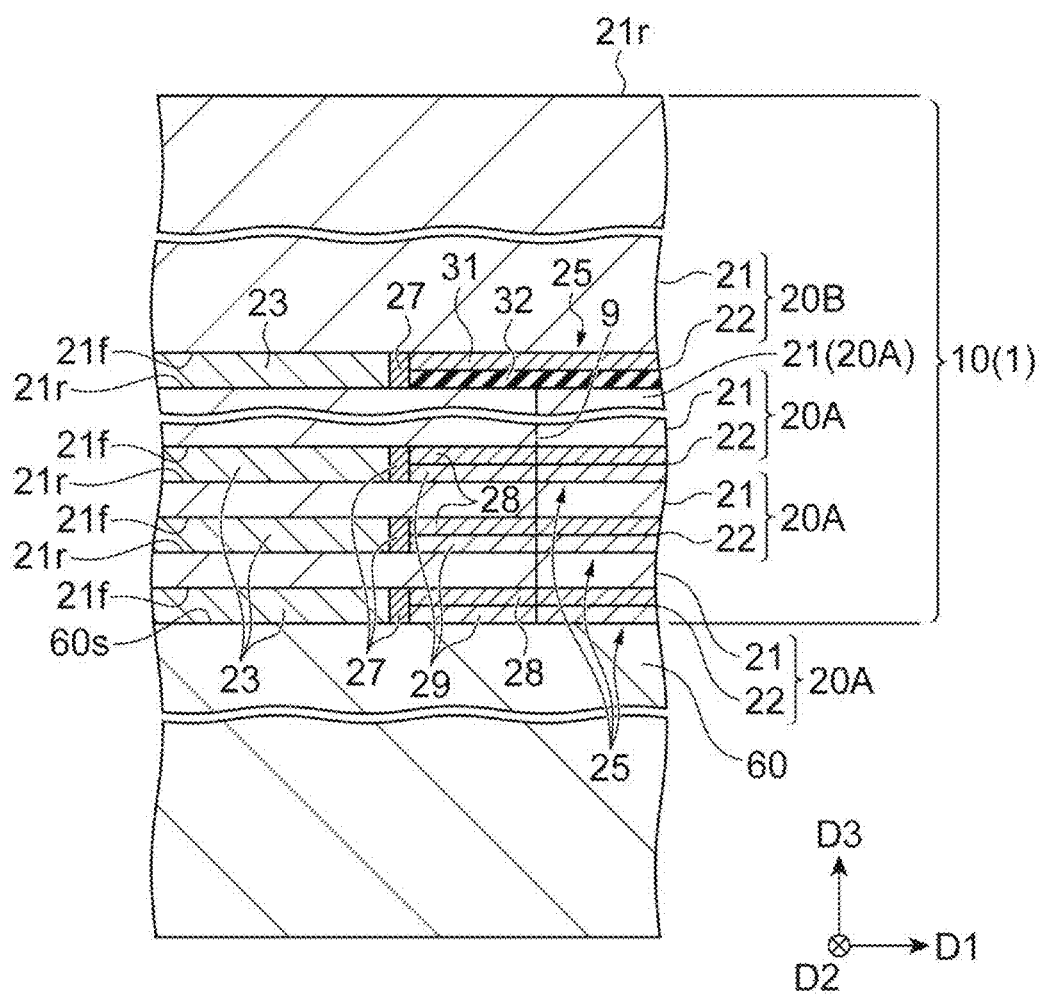
FIG. 31 is a diagram illustrating the main step of the laminated element manufacturing method according to the fourth embodiment.

Then, as illustrated in FIG. 31, a semiconductor wafer 20B is prepared, and a circuit layer 22 of the semiconductor wafer 20B is directly bonded to the semiconductor substrate 21 of the ground semiconductor wafer 20A. At this time, the functional elements 23 of the ground semiconductor wafer 20A correspond to the functional elements 23 of the semiconductor wafer 20B in the third direction D3, respectively. Thus, a laminated body 10 is obtained. Here, in the laminated body 10, the semiconductor substrates 21 and the circuit layers 22 are alternately laminated over the entirety of the laminated body 10.

Then, as illustrated in FIG. 15, the semiconductor substrate 21 is irradiated with the laser light L1 along each of the lines to cut 5a and 5b by using the back surface 21r of the semiconductor substrate 21 of the semiconductor wafer 20B as an incident surface of the laser light L1, and thus a modified region 7 is formed along each of the lines to cut 5a and 5b in the semiconductor substrate 21. In addition, a fracture 9 extending from the modified region 7 toward the circuit layer 22 of the semiconductor wafer 20B is formed in the semiconductor substrate 21. Here, the fracture 9 is formed to reach at least the interface between the semiconductor substrate 21 of the semiconductor wafer 20A and the circuit layer 22 of the semiconductor wafer 20B (that is, the directly bonded interface). The irradiation condition for the laser light L1 is as described in the first embodiment and the third embodiment.

Then, as illustrated in (a) of FIG. 16, the semiconductor substrate 21 of the semiconductor wafer 20B on which the modified region 7 is formed is ground. At this time, the modified region 7 is removed, and the fracture 9 is exposed to the back surface 21r of the semiconductor substrate 21 of the semiconductor wafer 20B. Here, the semiconductor substrate 21 is ground from the back surface 21r side, and thus the semiconductor substrate 21 (that is, the semiconductor wafer 20B) is thinned. Here, for example, the semiconductor substrate 21 of the semiconductor wafer 20B is ground such that the thickness of the semiconductor substrate 21 is about 200 μm. The reason that the semiconductor substrate 21 of the semiconductor wafer 20B is left to be thicker than that in the other semiconductor substrates 21 is that the semiconductor substrate 21 of the semiconductor wafer 20B serves as the support substrate in the laminated element 15.

Then, as illustrated in (b) of FIG. 16, the laminated body 10 is in a state of being supported by an expandable support member S such as an expanded tape. At this time, the back surface 21r of the semiconductor substrate 21 of the semiconductor wafer 20B is disposed on the support member S side. In this state, if the support member S is expanded, the plurality of laminated elements 15 obtained by cutting the laminated body 10 along each of the lines to cut 5a and 5b are separated from each other, and each laminated element 15 is picked up (pick-up step).

With the above laminated element manufacturing method according to the fourth embodiment, effects similar to those in the third embodiment are exhibited.

Modification Examples

The above-described embodiments are provided for describing one embodiment of the laminated element manufacturing method according to the present disclosure. Thus, the laminated element manufacturing method according to the present disclosure is not limited to the above-described embodiments, and any modification may be made in a range without changing the gist of the claims.

For example, the fracture 9 extending from the modified region 7 is not connected to the formed fracture 9 at the time when the modified region 7 is formed. Then, when the semiconductor substrate 21 is ground, the fracture 9 extending from the modified region 7 may be connected to the formed fracture 9. The fracture 9 along each of the lines to cut 5a and 5b is not continuous in the third direction D3 at the time when the laminated body 10 is configured, and may be separated at least partially. Even in this case, it is possible to cut the laminated body 10 along each of the lines to cut 5a and 5b by expanding the support member S.

Each of the lines to cut 5a and 5b may be set in a lattice shape so as to pass through the center (center of the width in a case of being viewed from a direction parallel to the third direction D3) of the metal wiring portions 26 provided in a lattice shape, and the laminated body 10 may be cut along each of the lines to cut 5a and 5b. In the step of configuring the laminated body 10, the modified region 7 is formed in the semiconductor substrate 21 along each of the lines to cut 5a and 5b, and thus it is possible to cut the laminated body 10 along each of the lines to cut 5a and 5b even in a case where the lines to cut 5a and 5b are set so as to pass through the center of the metal wiring portions 26.

In the above-described embodiments, when the two semiconductor wafers 20 are bonded to each other, the functional elements 23 are laminated to correspond to each other. Corresponding of the functional elements 23 of one semiconductor wafer 20 to the functional elements 23 of another semiconductor wafer 20 means that at least one functional element 23 of one semiconductor wafer 20 and at least one functional element 23 of another semiconductor wafer 20, in one active region 11, have a predetermined positional relationship. Therefore, for example, the corresponding is not limited to a case where the memory cells 22a of the functional elements 23 correspond to each other one by one, and one-to-many correspondence may be provided. Even in a case where the memory cells 22a have one-to-one correspondence, the correspondence is not limited to being arranged in the third direction D3, and a case where the positions in the first direction D1 and the second direction D2 are different from each other may be provided.

In the above embodiments, an example in which the circuit layer 22 is directly bonded to the semiconductor substrate 21 or another circuit layer 22 has been described. In a case where the circuit layer 22 is directly bonded, flattening processing may be performed on the front surface of the circuit layer 22. However, the flattening processing may mean that a flattening film made of resin or the like is formed on the front surface of the circuit layer 22 in addition to a case where flattening processing is performed on an insulating film or the like of the front surface of the circuit layer 22. That is, the circuit layer 22 may be bonded to the semiconductor substrate 21 or the circuit layer 22 in a state where another film-like layer is interposed. Thus, the bonding of the circuit layer 22 is not limited to the example of the direct bonding described above.

The configurations in the embodiment or the modification examples described above can be randomly applied to the configuration in another embodiment or modification examples.

REFERENCE SIGNS LIST 5a, 5b line to cut
7 modified region (first modified region, second modified region)
9 fracture (first fracture, second fracture)
15 laminated element
20A, 20B semiconductor wafer (first wafer, second wafer)
21 semiconductor substrate
21f front surface
21r back surface
22 circuit layer
23 functional element
L1, L2 laser light

The invention claimed is:

1. A laminated element manufacturing method comprising:
a first forming step of preparing a first wafer as a semiconductor wafer including a semiconductor substrate having a front surface and a back surface, and a circuit layer including a plurality of functional elements two-dimensionally arranged along the front surface, and forming a first modified region along a line to cut by irradiating the semiconductor substrate of the first wafer with a first laser light along the line to cut set to pass between each of the functional elements;
a first grinding step of grinding the semiconductor substrate of the first wafer after the first forming step;
a bonding step of preparing a second wafer as the semiconductor wafer and bonding the circuit layer of the second wafer to the semiconductor substrate of the first wafer such that each of the functional elements of the first wafer correspond to each of functional elements of the second wafer, after the first grinding step;
a second forming step of forming a second modified region along the line to cut by irradiating the semiconductor substrate of the second wafer with a second laser light along the line to cut, after the bonding step; and
a second grinding step of grinding the semiconductor substrate of the second wafer after the second forming step,
wherein in the first forming step, a first fracture extending from the first modified region toward the circuit layer of the first wafer is formed,
wherein in the second forming step, a second fracture extending from the second modified region toward the circuit layer of the second wafer is formed, and
wherein in the second forming step, the second fracture is formed to reach an interface between the semiconductor substrate of the first wafer and the circuit layer of the second wafer.

2. The laminated element manufacturing method according to claim 1, wherein
in the first grinding step, the first modified region is removed, and the first fracture is exposed to the back surface of the semiconductor substrate of the first wafer.

3. The laminated element manufacturing method according to claim 1, wherein
in the second grinding step, the second modified region is removed, and the second fracture is exposed to the back surface of the semiconductor substrate of the second wafer.

4. The laminated element manufacturing method according to claim 1, further comprising
a pick-up step of picking up a plurality of laminated elements obtained by cutting the first wafer and the second wafer along the line to cut, after the second grinding step.

5. A laminated element manufacturing method comprising:
a first grinding step of preparing a first wafer as a semiconductor wafer including a semiconductor substrate having a front surface and a back surface, and a circuit layer including a plurality of functional elements two-dimensionally arranged along the front surface, and grinding the semiconductor substrate of the first wafer;

a bonding step of preparing a second wafer as the semiconductor wafer and bonding the circuit layer of the second wafer to the semiconductor substrate of the first wafer such that each of the functional elements of the first wafer correspond to each of the functional elements of the second wafer, after the first grinding step;

a forming step of forming a modified region along a line to cut by irradiating a semiconductor substrate of the second wafer with a laser light along the line to cut set to pass between each of the functional elements, after the bonding step; and a second grinding step of grinding the semiconductor substrate of the second wafer after the forming step, wherein in the forming step, a fracture extending from the modified region toward the circuit layer of the second wafer is formed, and in the forming step, the fracture is formed to reach an interface between the semiconductor substrate of the first wafer and the circuit layer of the second wafer.

6. The laminated element manufacturing method according to claim 5, wherein in the forming step, the fracture is formed to reach an interface between the circuit layer of the first wafer and the semiconductor substrate of the first wafer.

7. The laminated element manufacturing method according to claim 5, wherein in the second grinding step, the modified region is removed, and the fracture is exposed to the back surface of the semiconductor substrate of the second wafer.

* * * * *